(12) United States Patent
Wang et al.

(10) Patent No.: US 8,975,727 B2
(45) Date of Patent: Mar. 10, 2015

(54) MEMORY CELL HAVING AN INTEGRATED TWO-TERMINAL CURRENT LIMITING RESISTOR

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Imran Hashim, Saratoga, CA (US); Tim Minvielle, San Jose, CA (US); Dipankar Pramanik, Saratoga, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 265 days.

(21) Appl. No.: 13/721,310

(22) Filed: Dec. 20, 2012

(65) Prior Publication Data
US 2013/0221315 A1  Aug. 29, 2013

Related U.S. Application Data

(63) Continuation-in-part of application No. 13/407,359, filed on Feb. 28, 2012, now Pat. No. 8,563,366.

(51) Int. Cl.
*H01L 29/8605* (2006.01)
*H01L 45/00* (2006.01)
*H01L 27/24* (2006.01)

(52) U.S. Cl.
CPC ............... *H01L 45/12* (2013.01); *H01L 45/08* (2013.01); *H01L 45/10* (2013.01);

(Continued)

(58) Field of Classification Search
USPC ............... 257/2, 4, 43, E29.068, E47.001; 365/148, 161
See application file for complete search history.

(56) References Cited

U.S. PATENT DOCUMENTS 6,465,804 B1  10/2002  Shamir
(Continued)

FOREIGN PATENT DOCUMENTS

WO  WO-2010-042732 A2  4/2010

OTHER PUBLICATIONS

Nardi, F., et al; Control of Filament Size and Reduction of Reset Current Below 10 uA in NiO Resistance Switching Memories; Jan. 1, 2011; Academia—Politecnico di Milano; SolidState Electronics pp. 4247.

(Continued)

*Primary Examiner* — Brett Feeney
*Assistant Examiner* — Pamela E Perkins

(57) ABSTRACT

A resistor structure incorporated into a resistive switching memory cell with improved performance and lifetime is provided. The resistor structure may be a two-terminal structure designed to reduce the maximum current flowing through a memory cell. A method is also provided for making such a memory cell. The method includes depositing a resistor structure and depositing a variable resistance layer of a resistive switching memory cell of the memory cell, where the resistor structure is disposed in series with the variable resistance layer to limit the switching current of the memory cell. The incorporation of the resistor structure is very useful in obtaining desirable levels of switching currents that meet the switching specification of various types of memory cells. The memory cells may be formed as part of a high-capacity non-volatile memory integrated circuit, which can be used in various electronic devices.

20 Claims, 9 Drawing Sheets

(52) U.S. Cl.
CPC ....... *H01L 45/1233* (2013.01); *H01L 45/1253* (2013.01); *H01L 45/146* (2013.01); *H01L 27/2409* (2013.01); *H01L 27/2463* (2013.01)
USPC ........... 257/536; 257/4; 257/E29.068; 35/148

(56) References Cited

U.S. PATENT DOCUMENTS

| | | | |
|---|---|---|---|
| 6,813,180 | B2 | 11/2004 | Forbes |
| 6,946,673 | B2 | 9/2005 | Zonca et al. |
| 7,271,081 | B2 | 9/2007 | Li |
| 7,427,802 | B2 * | 9/2008 | Wuidart et al. ............... 257/538 |
| 7,633,108 | B2 | 12/2009 | Li |
| 2007/0008773 | A1 | 1/2007 | Scheuerlein |
| 2007/0015348 | A1 | 1/2007 | Hsu et al. |
| 2009/0003036 | A1 * | 1/2009 | Kumar et al. ................. 365/148 |
| 2009/0303772 | A1 | 12/2009 | Rinerson et al. |
| 2010/0085798 | A1 | 4/2010 | Lu |
| 2013/0026438 | A1 | 1/2013 | Wang |
| 2013/0028003 | A1 | 1/2013 | Wang |
| 2014/0117303 | A1 * | 5/2014 | Wang et al. ....................... 257/4 |

OTHER PUBLICATIONS

Tirano, S., et al.; Accurate Analysis of Parasitic Current Overshoot During Forming Operation in RRAMs; Jan. 1, 2011; CEA-LETI, France; Microelectronic Engineering pp. 11291132.

Nunomura, K., et al.; TaSiC Thin Film Resistors for Highly Reliable Thermal Printing Heads; Dec. 1, 1983; NEC Corporation; IEEE Transaction on Components Hybrids and Manufacturing Technolgoy vol. CHMT6 No. 4 pp. 377380.

Wong, J., et al.; Thin Film Embedded Resistors; ; Gould Electronics; Unknown.

Chen, C., et al.; Nitrogen Implanted Polysilicon Resistor for HighVoltage CMOS Technology Application; ; Academia —National Cheng Kung University, Taiwan; IEEE Electron Device Letters vol. 22 No. 11 pp. 524526.

Guo, X., et al.; Tunneling Leakage Current in Oxynitride Dependence on OxygenNitrogen Content; Jun. 1, 1998; Yale University (New Haven, CT) ; IEEE Electron Device Letters vol. 19 No. 6 pp. 207209.

Chen, A.; Current Overshoot During Set and Reset Operations of Resistive Switching Memories; Jan. 1, 2012; IEEE; pp. MY0201MY02.4.

Nardi, F., et al.; Reset Current Reduction and SetReset Instabilities in Unipolar NiO RRAM; Jan. 1, 2011; IEEE; 4 pages.

* cited by examiner

MEMORY CELL HAVING AN INTEGRATED TWO-TERMINAL CURRENT LIMITING RESISTOR

CROSS-REFERENCE TO RELATED APPLICATIONS

This application is a continuation-in-part (CIP) of U.S. patent application Ser. No. 13/407,359, entitled "MEMORY DEVICE HAVING AN INTEGRATED TWO-TERMINAL CURRENT LIMITING RESISTOR," filed on Feb. 28, 2012, which is incorporated herein by reference in its entirety for all purposes.

BACKGROUND

1. Technical Field

This disclosure relates generally to the formation of resistive switching memory cells and, more specifically, to memory cells including resistor structures.

2. Description of the Related Art

Nonvolatile memory devices are used in systems in which persistent storage is required. For example, nonvolatile memory cards are used in digital cameras to store images and in digital music players to store audio data. Nonvolatile memory devices are also used to persistently store data in computer environments.

Electrically-erasable programmable read only memory (EEPROM) technology is often used to form and program nonvolatile memory devices. This type of nonvolatile memory contains floating gate transistors that can be selectively programmed or erased by application of suitable voltages to their terminals. As fabrication techniques improve, it is becoming possible to fabricate nonvolatile memory devices with increasingly smaller dimensions. However, as device dimensions shrink, scaling issues pose challenges for traditional nonvolatile memory technology. This has led to the investigation of other alternatives, including nonvolatile resistive switching memory technology.

Nonvolatile resistive switching memory may be formed using memory cells that have two or more stable resistances states. Voltage pulses are used to switch the resistive switching memory element from one resistance state to the other. For example, a bistable memory cell having a resistive switching memory element with two stable resistance states can be placed in a high resistance state or a low resistance state by applying suitable voltages or currents. Nondestructive read and write operations can be performed to ascertain the value of a data bit that is stored in a memory cell.

Resistive switching based on having a resistive switching memory element formed of transition metal oxide (MO) films within a memory cell has been demonstrated. Although such metal oxide (MO) films exhibit bistability, the resistance of these MO films and/or the ratio of the high-to-low resistance states is (are) often insufficient to be of practical use within nonvolatile memory. For instance, the resistance states of a metal oxide film should preferably be significant as compared to that of a memory system (e.g., memory with associated circuitry) so that any change in the resistance state is perceptible. Since the variation in the difference between the resistance states is related to the resistance of the resistive switching memory element, it is often hard to use a low resistance metal oxide film to form a reliable nonvolatile memory device. For example, in a nonvolatile memory device having conductive lines formed of a relatively high resistance metal such as tungsten, the resistance of the conductive lines may overwhelm the memory cell if the resistance of the metal oxide-containing resistive switching element is not sufficiently high. This may make it difficult or impossible to sense the resistance state of the bistable metal oxide resistive switching element.

Similar issues can arise from integrating a resistive switching memory element with a current steering element (typically a diode and/or resistor). The resistance of the resistive switching memory element (at least in its high resistance state) is preferably significant compared to the resistance of the current steering element, so that the unvarying resistance of the current steering element does not dominate the total resistance of the memory cell/device, and thus reduce the measurable difference between the "on" and "off" states of the formed memory cell/device (i.e., logic states of the device). Since the overall power that can be delivered to a circuit containing a series of connected memory cells with resistive switching memory elements and current steering elements is typically limited in most conventional nonvolatile memory devices (e.g., CMOS driven devices), it is desirable to form each of the resistive switching memory elements and current steering elements in the circuit so that the voltage-drop across each of these elements is small, and thus the overall resistance of the series of these connected elements does not cause the current to decrease to an undesirable level when a high voltage level (e.g., ~2-5 volts) is applied.

As the sizes of the nonvolatile memory device shrink, it is important to reduce the required currents and voltages that are necessary to reliably set, reset and/or determine the desired "on" and "off" states of the memory device to minimize the overall power consumption of a memory chip as well as resistive heating of the devices within the memory chip and cross-talk between adjacent memory devices. Moreover, it becomes increasing necessary to assure that the "set" and "reset" currents used to change the resistance state of the resistive switching memory element are not too large to alter the electrical or physical properties of the one or more layers found in the interconnected memory devices.

A large current flowing through the current carrying lines in a memory device (e.g., a memory array) can also undesirably alter or disturb the "logic" state of the interconnected memory cells or possibly damage portions of the adjacently connected memory cells, due to an appreciable amount of "cross-talk" between the formed memory cells. Therefore, there is a need to limit and/or minimize the required current used to sense and program the logic states of each of the interconnected memory cells, in an effort to reduce chip overall power consumption as well as improve device longevity and reduce the chance that cross-talk between adjacently connected memory cells. Therefore, it is desirable to form a nonvolatile memory device that allows low programming currents to be used when switching the device between the "on" and "off" states.

SUMMARY

Embodiments generally provide a memory cell having a first electrode layer, a resistor structure, and a variable resistance layer disposed between the first electrode layer and the resistor structure. The resistor structure is generally a two-terminal structure integrated into memory cells and systems to change the electrical characteristics of each memory cell such that each memory cell is able to meet more stringent memory cell specification requirements (e.g., stringent low maximum current limit, stable memory cell switching, and longer memory cell lifetime, among others).

The two-terminal resistor structure may include a first material layer, a second material layer, and a lightly doped material layer disposed between the first and the second material layers. The first and the second material layers can be, for example, a heavily doped n-type semiconductor layer, a heavily doped p-type semiconductor layer (e.g., heavily doped polysilicon) or a conductive metal layer (e.g., titanium nitride). In some embodiments, the first material layer or the second material layer may be a part of another component of the memory cell, e.g., a part of a current steering element. In some embodiments, the resistor structure may include a single layer formed from a homogeneous material, such as a lightly doped polysilicon. In other words, the resistor structure may include only one layer. In some embodiments, the resistor structure may include a lightly doped material layer, a heavily doped material layer, and a diffusion barrier layer provided between the lightly doped material layer and the heavily doped material layer.

The two-terminal resistor structure is capable of limiting the current that flows through each resistive switching memory cell in response to various applied current or voltage levels. The resistor structure has a specific resistance determined by the resistivity and thickness of the resistor structure. In some embodiments, the resistivity of the lightly doped material is at least about at least about 1 Ohm-cm in a direction normal to the height of a stack formed by the resistor structure, the variable resistance layer, and other components of the memory cell. More specifically, the resistivity in this direction may be at least about 5 Ohm-cm and even at least about 10 Ohm-cm. It should be noted that resistivity in other directions may different. In some embodiments, the resistivity of the lightly doped material within a plane normal to the height of the stack is less than about 0.001 Ohm-cm or, more specifically, less than about $10^{-5}$ Ohm-cm. In some embodiments, the thickness of the resistor structure is less than about 200 Angstroms or, more specifically, less than about 50 Angstroms.

For purposes of this disclosure, lightly doped materials are defined as materials having dopant concentrations of less than $10^{16}$ atoms/cm$^3$. Highly doped materials are defined as materials having dopant concentrations of greater than $10^{18}$ atoms/cm$^3$. The doping level defines resistivity and other properties of the materials as further described below.

The variable resistance layer of the memory cell includes a resistive switching material capable of switching between two resistive states upon application of a predetermined voltage to the variable resistance layer. Specifically, the resistive switching material may be in a low resistive state (LRS) corresponding to a low resistance of the variable resistance layer and, separately, may be in a high resistive state (HRS) corresponding to a high resistance of the variable resistance layer. While both LRS and HRS are stable states, the resistive switching material may be switched between these two states upon application of a voltage, usually one voltage level to switch from its LRS to its HRS and another voltage to switching from its HRS to its LRS. A reading voltage may be applied to the variable resistance layer to determine its resistive state without changing that resistive state. Some examples of resistive switching materials include hafnium oxide, tantalum oxide, aluminum oxide, lanthanum oxide, yttrium oxides, dysprosium oxide, ytterbium oxide, and zirconium oxide.

In some embodiments, methods of forming memory cells are provided. The method includes forming a two-terminal resistor structure and depositing a variable resistance layer, where the two-terminal resistor structure is disposed in series with the variable resistance layer to limit the switching current of the memory cell. In some embodiments, the current limiting resistor is a two-terminal structure disposed within a resistive switching memory element of a memory cell. For example, the current limiting resistor can serve as an intermediate electrode layer within a memory cell. In another aspect, the current limiting resistor is a two-terminal structure disposed in series with a memory element of a memory cell.

One example of the current limiting resistor is an n-type resistor including a lightly doped N$^-$ region between two heavily doped N$^+$ regions. Another example is a lightly doped N$^-$ region between two conductive metal regions. Still another example is a p-type resistor including a lightly doped P$^-$ region between two heavily doped P$^+$ regions or two conductive metal regions.

The measured current versus voltage plot of the resulting memory cell having the resistor structure, which is sometimes referred to as a current limiting resistor or an embedded resistor, exhibits a non-linear resistance curve. The curve illustrates a linear current to voltage relationship at low voltage levels and a reduced saturated current flow at higher applied voltage levels. By tailoring the electrical characteristics of the current limiting resistor (e.g., the thickness (L) and resistivity ($\rho$) of the lightly doped material layer of the resistor structure), the value of the saturation current ($I_{MAX}$) or compliance current ($I_{CC}$) can be controlled so that it is reached at low bias voltages, which are greater than the voltage applied during the read operation, $V_{READ}$. Thus, while preventing the "on" and "off" currents from being dramatically reduced by the addition of the currently limiting resistor, the incorporation of the current limiting resistor into a memory cell is very useful in forming an array of memory cells that will each minimize the total leakage current and are each protected from being damaged during the application of a programming pulse to at least one of the memory cells disposed in a memory cell.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
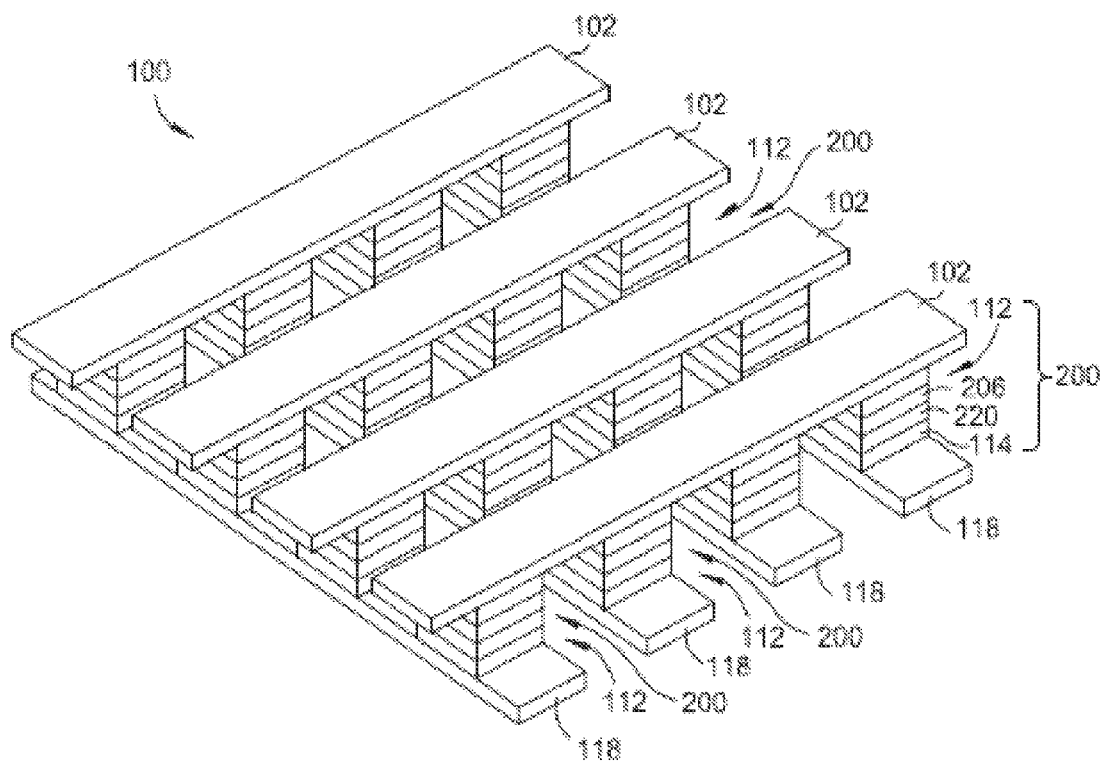
FIG. 1A illustrates an array of resistive switching memory elements in accordance with some embodiments.

While the foregoing is directed to embodiments of the present invention, other and further embodiments of the invention may be devised without departing from the basic scope thereof, and the scope thereof is determined by the claims that follow.

DETAILED DESCRIPTION

Embodiments generally include methods of incorporating a resistor structure, i.e., a current limiting component, into resistive switching memory cells or memory elements to reduce the current levels required during memory cell switching operations and the current levels required to measure the memory cell logic states. This current reduction improves the memory cell performance and increases its usable lifetime. In some embodiments, the current limiting component includes a two-terminal structure that is connected in series with a resistive switching memory element disposed in a memory cell and provides non-linear resistances at different applied voltages or currents. The resistor structure may be disposed within a resistive switching memory element in a nonvolatile resistive switching memory cell.

In some embodiments, the resistor structure includes one or more layers of a resistive material that has a desirable non-linear resistance (i.e., current versus voltage) characteristics, such that at low voltage levels during a read operation, currents flowing through a memory cell are high enough to be detectable, and at high voltage levels during switching operations, currents are not too high to cause damage to the memory cell. The incorporation of such a resistor structure into a memory cell is easy to fabricate and allow less complex structures to be formed.

Some examples of suitable resistive materials include certain semiconductor materials, such as silicon (Si), germanium (Ge), any of the Group III-V materials, gallium arsenic (GaAs), and others. The resistive material may be a doped n-type or p-type material, depending on the type of dopant incorporated. The resistive material can be either crystalline or polycrystalline depending on the processing sequence. In some embodiments, the resistive material is fabricated in a portion of a memory cell. In other examples, the resistive material is fabricated in the semiconductor substrate on which the memory cell is fabricated and is doped with n-type or p-type dopants by ion implantation and thermal treatment. In such cases, the resistor is fabricated in the silicon substrate prior to depositing a resistive switching memory cell thereon. As another example, the resistive material is a polycrystalline silicon material (polysilicon) doped with a dopant, such as phosphorus (P), arsenic (As), antimony (Sb), boron (B), and aluminum (Al), among others.

The resistor structure may include a lightly doped material layer disposed between other layers of a memory cell. In some embodiments, the resistor structure includes multiple layers, such as a lightly doped material layer, a first material layer, and a second material layer. The first material layer and/or the second material layer may be operable as intermediate electrodes (directly interfacing the variable resistance layer), as diffusion barrier layer, parts of current steering elements, and other component types. In some embodiments, the lightly doped material layer is doped with a dopant concentration of about 1E16 atoms/cm$^3$ or below, such as between about 1E13 atoms/cm$^3$ and about 1E16 atoms/cm$^3$. In general, dopant levels are determined based on specific applications and design considerations of ReRAM cells. For example, a ReRAM cell may have a target switching voltage of 2 V and switching currents of about 10 uA. In this example, the total resistance of the cell about 200 kOhm (i.e., 2 V/10 uA). In some embodiments, an embedded resistor used in this cell has a comparable resistance, i.e., 100 kOhm. If the embedded resistor has a thickness of about 100 Angstroms and has a footprint of about 20 nanometers in each side (i.e., 20 nm cell size), the resistivity of a material used for such embedded resistor should be about 0.8 ohm-cm. For the n+ doped polysilicon, the doping level to achieve this resistivity is about 1E16 cm-3. For the other example of embedded resistor film thickness and cell area, the resistivity will be different and corresponding doping level is different. Examples of the lightly doped material layer of the resistor structure include a lightly doped N$^-$ layer and a lightly doped P$^-$ layer or, more specifically, N$^-$ doped polysilicon and P$^-$ doped polysilicon. In some embodiments, the first and the second material layers include a heavily doped polysilicon material or a conductive metal material. Examples of the first and second material layers of the resistor structure include a conductive metal material layer, a heavily doped N$^+$ silicon layer, a heavily doped P$^+$ silicon layer, among others. The first and second material layers may be doped with a dopant such as phosphorus, arsenic, antimony, boron, aluminum, among others, to a high dopant concentration of about 1E19 atoms/cm$^3$ or above, such as about 1E20 atoms/cm$^3$ or above. The conductive metal layer may include a metal material, such as titanium nitride (TiN), titanium (Ti), tantalum nitride (TaN), tantalum (Ta), or tungsten (W). In still another aspect, each of the first and second material layers may contain two or more material layers. For example, the first material layer may contain a heavily doped material layer and a layer of a conductive metal material, such as titanium nitride, titanium, tantalum nitride, tantalum, tungsten, among others, to serve as a barrier layer to minimize leakage.

The resistor structure is incorporated into a memory cell capable of switching between at least two or more stable resistance states, each with a different resistance. A resistive switching memory element generally includes an MIM (metal-insulator-metal) stack, wherein the insulator is a variable resistance layer including a metal oxide material. The metal oxide insulator offers bistable resistance for a resistive switching memory cell. A number of nonvolatile memory cells can be interconnected to form one or more memory arrays and cells prior to being connected to at least one control circuitry, and ultimately, fabricated into memory chips. Nonvolatile resistive switching memory cells may be formed as part of a high-capacity nonvolatile memory integrated circuit, which can be used in various electronic devices, such as digital cameras, mobile telephones, handheld computers, and music players, among others. Resistive Random Access Memory (RRAM or ReRAM) is often made by arranging a number of memory cells into cross point memory arrays in order to increase the density of the memory cells connected together in a memory chip.

Even though significant progress has been made to reduce the compliance current limit for a resistive switching memory cell, the programming current levels for conventional memory cells are still much higher than required levels to cause the switching memory cells to switch. For example, a resistive switching memory cell may require its maximum programming current be under a compliance current limit of less than 10 uA (microamps). Conventional resistive switching memory elements generally exhibit large switching programming currents and it has been very difficult to reduce them to below several tens of microamps so that they are under the compliance current limit. Previous solutions have used a single transistor in series with the memory element, but this is generally not compatible with the architecture of crossbar memory arrays, since the transistors typically cannot be stacked vertically. In addition, such approaches require additional processing as well as additional interconnects to connect to the gate of the transistor. Due to these issues, either the resistive memory element is required to have a low resistance so that switching power is low or other dielectric layers are added to the stack of the resistive element to act as a current limiter.

It is contemplated that the desired specifications for low switching currents can be achieved if the magnitudes of the currents flowing through the memory cell are limited during an "electrical-forming" stage as well as during "switching" ("set" and "reset") operations. In practice, this is very difficult as parasitic capacitor-like elements that are connected to the interconnected memory cells and coupled to the electrodes of the memory cells and arrays tend to induce large currents independent of any control device, which is separated from a resistive switching memory cell.

Integration or, more specifically, embedding of the resistor structure in a memory cells limits and/or minimizes the required current level used to sense and program the logic states for each of the interconnected memory cells, reduces chip overall power consumption, improves device longevity, reduces the chance of cross-talk between adjacently connected memory cells, and avoids undesirable altering of the memory cell's logic state by such cell cross-talk. The resistor structure may be incorporated to be adjacent to the resistive switching memory element of a memory cell, such as disposed "in series" with or "within" a portion of the resistive switching memory element.

In some embodiments, the compliance current limit (i.e., $I_{CC}$ or $I_{MAX}$) are set at the desirable switching currents levels that meet the specification requirements. The resistor structure is disposed within each resistive switching memory cell to control and limit the maximum current flowing therethrough. In addition, the resistor structure provided herein is a two-terminal structure that is connected to the resistive switching memory element to meet the area requirements for dense flash memories. In some configurations, the resistor structure is disposed horizontally and/or vertically over a surface of a chip on which the memory is formed. The resistor structure is compatible with the use of a current steering element, which is typically a diode. Further, the resistor structure is capable of withstanding the voltages that develop across a memory cell during switching.

The resistor structure may be formed and integrated in such a way that the voltage-drop across each of these elements is small and thus the overall resistance of the series of these connected elements does not cause the current to decrease to an undesirable level due to a fixed voltage (e.g., between 2 volts and 5 volts) applied to the memory circuit. Thus, the resistor structure is provided to form a nonvolatile memory cell so that low programming currents can be used when switching the nonvolatile memory cell between the "on" and "off" states.

The electrical properties of the formed current limiting structure, or resistor, are configured to lower the maximum current limit that can flow through the variable resistance layer of the resistive switching memory element to prevent the transmitted current from without damaging the memory cell. This objective is obtained, in part, by providing a non-linear resistance in the formed nonvolatile resistive switching memory cell, where the resistance is low at low voltage levels (e.g., the voltages applied during read operations) and the resistance is high at high voltage levels (e.g., the voltages applied at set, reset, and switching operations). It is generally desirable to form the resistor structure so that its material and electrical properties will not degrade or breakdown during the often high current "burn-in" type preparation steps, such as the "electrical forming" process, and also during normal repetitive set, reset, or switching operations of the nonvolatile resistive switching memory cell.

In some embodiments, selection of materials used to form the resistor structure, thicknesses for each material layer in the structure lowers the maximum current limit ($I_{MAX}$) that is able to pass through the formed memory cell to meet the specification requirement of cell compliance current ($I_{CC}$). The material layers of the resistor structure are selected and formed, and the currents flowing through the memory cell having the two-terminal resistor structure are measured. The resulting current-versus-voltage measurements show that the measured current values are in a linear dependency relationship at low voltage levels during "read" or "sensing" operations and are relatively constant at high voltage levels applied during "set", "reset", or "switching" operations.

A resistor structure is generally a two-terminal structure having a resistance characteristic that varies in a non-linear manner. As will be discussed in detail below, the resistance of the resistor structure is relatively low during "read" operations and relatively high at higher voltage levels during "programming" operations (e.g., set, reset or switching operations) due to its non-linear nature. The incorporation of the resistor structure into the memory cell allows the overall switching currents to be lower than conventional memory cells that do not include such resistor structures, and in turn, allows for a reduced overall operating power and the use of larger memory array sizes.

Figure 2A:
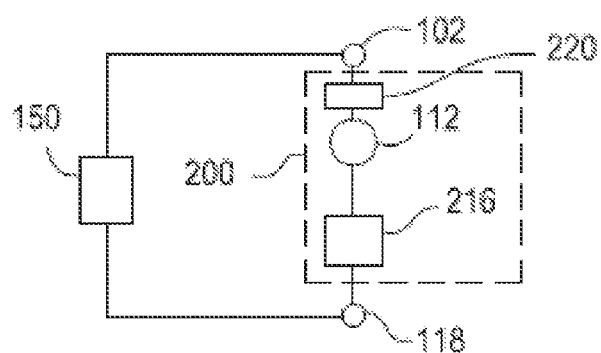
FIG. 2A is a schematic representation of a memory cell, in accordance with some embodiments.
Figure 2B:
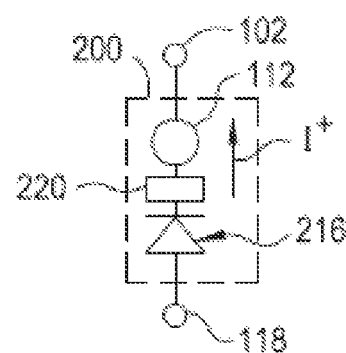
FIG. 2B is a schematic representation of a memory cell having a diode type current steering element, in accordance with some embodiments.
Figure 2C:
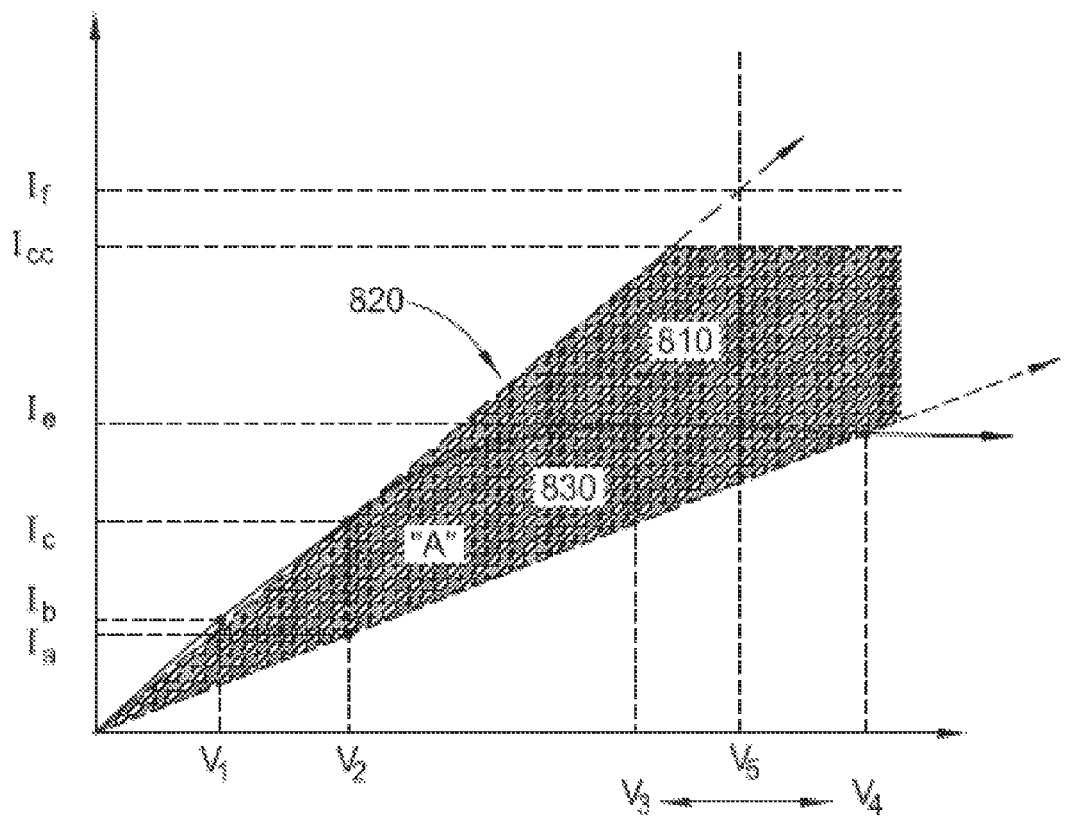
FIG. 2C is a current versus voltage plot illustrating the characteristics of a two-terminal resistor structure, in accordance with some embodiments.

In general, it is desirable that the resistor structure exhibits a "non-linear" current-versus-voltage curve (e.g., a curve 810, as shown in FIG. 2C and discussed in detail below), where the current flowing through the resistor structure is high enough so that it is easily measurable at low voltage levels, such as at $V_{READ}$ levels and at least nearly saturated at high voltage levels, such as at $V_{SET}$ or $V_{RESET}$ levels during switching operations ($V_{SET}$ and $V_{RESET}$ are generally referred to as "switching voltages" herein). In some embodiments, a desirable current level flowing through the resistor structure can be obtained by adjusting the electrical or physical properties of the material layers of the resistor structure, such as increasing the dopant concentrations to increase free carrier density in the resistor structure or increasing the cross-sectional area of the resistor structure.

In a desirable "non-linear" I-V curve (e.g., the curve 810, as shown in FIG. 2C and discussed in detail below) of the resistive properties of a formed desirable resistor structure, the current flowing through a memory cell may be dependent on the applied voltage levels in a substantially linear relationship at the low voltage ranges and flattened out, or saturated, at high voltage ranges. In contrast, an ideal resistor typically exhibits a "linear" resistance curve (e.g., curves 820 and 830, as shown in FIG. 2C and discussed in detail below). These types of "linear" resistors are not suitable or not preferred to be incorporated into a memory cell to limit or regulate current flow. The I-V characteristics of these linear resistors are not compatible, because it is not possible to simultaneously meet the requirements of low compliance current, $I_{CC}$ (as set by specifications and tested at high voltages) and also achieve high read currents (tested at low voltages). Accordingly, it is designed to tailor the thickness and resistivity of the formed lightly doped material layer of the resistor structure to obtain desirable "non-linear" I-V electrical characteristics. Overall main characteristics of an embedded resistor include a low resistance (not to be current limiting) at reading voltage (which is a relatively low voltage in comparison, e.g., to switching voltages) and high resistance (to be current limiting) at switching voltages (i.e., higher voltages than used for reading). For purposes of this disclosure, the resistance linearity can be defined as a ratio of a resistance at a high switching voltage (e.g., about 4V) to a resistance at a low reading voltage (e.g., about 0.5V). In some embodiments, this ratio is at least about 1 or more. The embedded resistor may be still workable even is this ration is less than 1 but greater than 0.2, however a higher ratio is generally preferred.

FIG. 1A illustrates one example of a memory device 100 in accordance with some embodiments. The memory device 100 may be part of a larger memory device, array, system or other integrated circuit structures, such as a chip type device. The memory device 100 includes a number of memory cells 200. In some embodiments, memory cells 200 can be spatially arranged as shown in FIG. 1A. The memory cells 200 can be also arranged in other configurations.

Each memory cell 200 generally includes one or more conductive layers. The one or more conductive layers may be operable as or include an electrode 102 and an electrode 118 disposed in the upper and lower side of the memory cell 200. Electrodes 102 and 118 may be referred to as top and bottom electrodes or first and second electrodes to distinguish between the two. However, this naming convention does not imply any order of depositing the electrodes or spatial orientation of the electrodes unless specifically noted. Each conductive layer has a desired function in the interconnected memory cells 200. In some configurations, the electrodes 102 and 118 each include two or more conductive layers in which a first conductive layer is used to interconnect a number of the memory cells 200 and a second conductive layer is disposed in each memory cell 200 to provide a desirable electrical interface (e.g., desirable work function) to the adjacent components in the memory cell 200. The memory cells 200 can be accessed individually or in groups using appropriate sets of word-lines and bit-lines, conveniently formed by the electrodes 102 and 118.

The memory cell 200 may further include a resistor structure 220 and one or more additional layers 114. The resistor structure 220 may contain a lightly doped silicon containing material, such as lightly doped polysilicon or, more specifically, lightly doped n-type polysilicon (i.e., n-polysilicon) or lightly doped p-type polysilicon (i.e., p-polysilicon). Other examples include germanium containing materials and gallium arsenide (GaAs) containing materials. Dopant concentrations can be adjusted to achieve specific resistivity levels of one or more materials forming the resistor structure 220. For example, polysilicon's resistivity can be modified by suitable doping. The following table summarizes the resistivity values of the n-doped polysilicon as a function of dopant concentration.

TABLE 1

| Resistivity (Ohm-cm) | Doping Level (Atoms/cm$^{-3}$) |
| --- | --- |
| 0.0001 | 1.20E+21 |
| 0.001 | 1.70E+20 |
| 0.01 | 8.49E+18 |
| 0.1 | 2.77E+17 |
| 1 | 1.46E+16 |
| 10 | 1.34E+15 |
| 100 | 1.33E+14 |
| 1000 | 1.30E+13 |
| 10000 | 1.30E+12 |

In some embodiments, the lightly doped material used for the resistor structure 220 has a dopant concentration of less than about $10^{16}$ atoms/cm$^3$ or, more specifically, less than about $10^{14}$ atoms/cm$^3$ or even less than about $10^{12}$ atoms/cm$^3$. The lightly doped material may have a resistivity of at least 1 Ohm-cm in a direction along the height of the stack formed by the resistor structure 220 and other layers 114 of the memory cell 200. In some embodiments, the resistivity in this direction is at least about 5 Ohm-cm and even at least about 10 Ohm-cm. The dopant concentration may be specifically controlled to achieve the resistivity of between about 1.8 Ohm-cm to about 3.7 Ohm-cm. It should be noted that the resistivity and corresponding dopant concentration is selected based on a desired resistance and design characteristics of ReRAM cells, such as thickness and footprint size (i.e., cell size).

Polysilicon and other like materials can withstand high voltages and current densities without breaking down. In some embodiments, the breakdown voltage of the material forming the resistor structure 220 or a portion thereof is at least about 8 Volts or, more specifically, at least about 12 Volts. In some embodiments, the resistivity of this material changes by less than 10% upon applying an electrical field of 1 MV/cm.

Various n-type and p-type dopants can be used to control the resistivity of the materials forming the resistor structure 220. Some examples of such dopants include phosphorus, arsenic, antimony, boron, aluminum, indium, and gallium. In some embodiments, more than one dopant is present in the same layer of the resistor structure 220.

As noted above, one or more additional layers of the resistor structure 220 may include a conductive metal material and/or a heavily doped material, such as heavily doped n-type polysilicon (n$^+$ polysilicon) and/or heavily doped p-type polysilicon (p$^+$ polysilicon), among others. These additional layers may ensure a good electrical contact to layers above and/or below the resistor structure 220. These layers may directly interface the variable resistance layer and ensure that the resistive switching material of this variable resistance layer is capable of switching between two resistive states upon application of a predetermined voltage. Such layers often referred to as electrode layers. In some embodiments, a layer provided the resistor structure 220 may function as a diffusion barrier layer and interface directly the lightly doped layer. The diffusion barrier layer prevents further contamination of the lightly doped layer thereby preserving its resistivity.

One or more additional layers 114 may form into at least one resistive switching memory element 112. For example, the resistive switching memory element 112 may contain an MIM (metal-insulator-metal) stack, where an insulator material layer is stacked between one or more conductive metal material layers. The one or more conductive metal material layers may be operable as a top electrode layer (e.g., the electrodes 102), an intermediate electrode layer (e.g., an electrode 210 in FIG. 3B), or a bottom electrode layer (e.g., the electrode 118). The insulator material layer is usually a variable resistance layer including a metal oxide material, such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$), among others. Other examples include nitrides and oxide nitrides, such as HfSiOx and HfSiON.

The metal oxide insulator material layer offers bistable resistance for the memory cell 200. In addition, the one or more additional layers 114 may contain a current steering element (e.g., a current steering element 216 as shown in FIG. 1B, 2A-2B).

The memory device 100 can be stacked in a vertical fashion or in other configurations to form various types of multilayered memory array structures. The use of the resistive switching memory elements 112, the resistor structure 220, and the one or more additional layers 114 to form memory cells, arrays and devices as shown in FIG. 1A is merely illustrative, and one skilled in the art would appreciate that the formed devices may be used in other applications without deviating from the spirit of the disclosure.

Figure 1B:
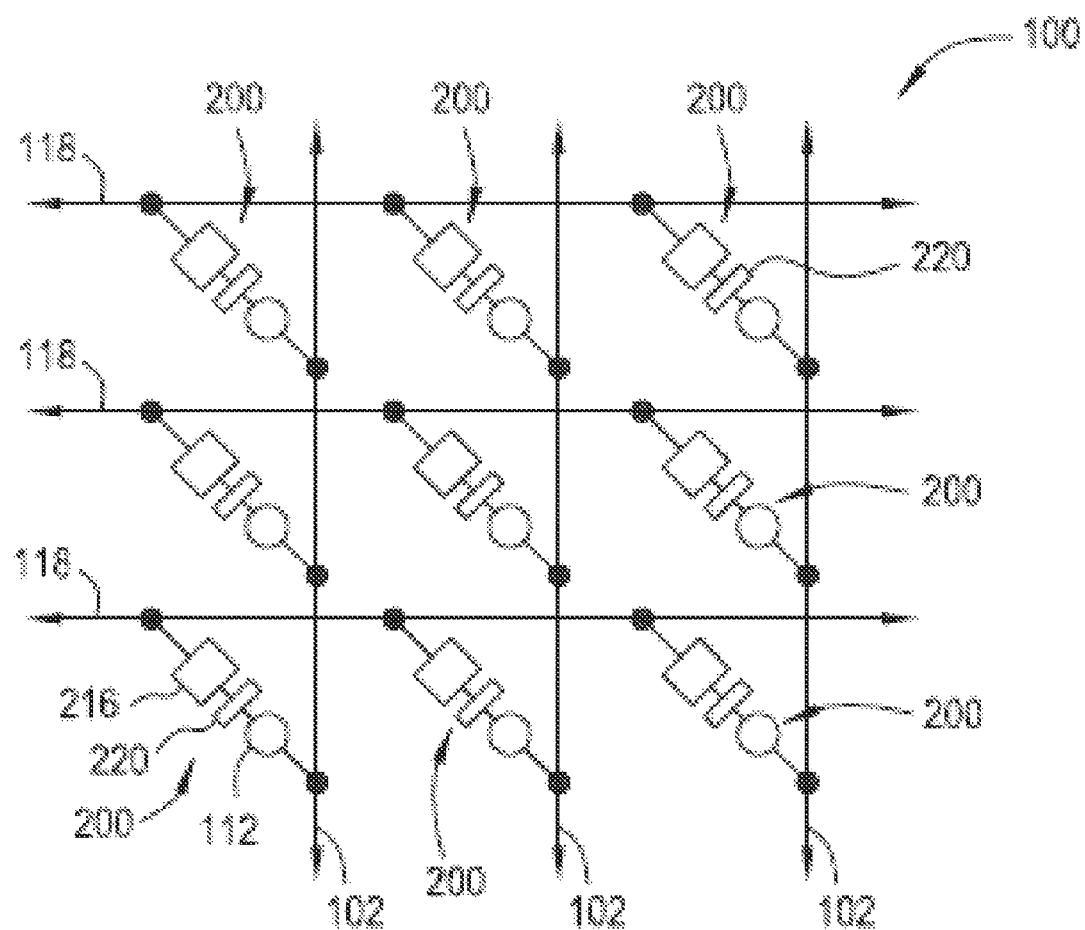
FIG. 1B is a schematic representation of an array of memory cells in accordance with some embodiments.

FIG. 1B schematically illustrates an example of the memory device 100 having multiple memory cells 200 connected together to form part of a high-capacity nonvolatile memory integrated circuit that can be formed on a memory chip. In accordance with some embodiments, each of the memory cells 200 may include one resistor structure 220, one resistive switching memory element 112, and one current steering element 216 (e.g., a diode type current steering element) that are connected to electrodes 102 and 118.

Figure 3A:
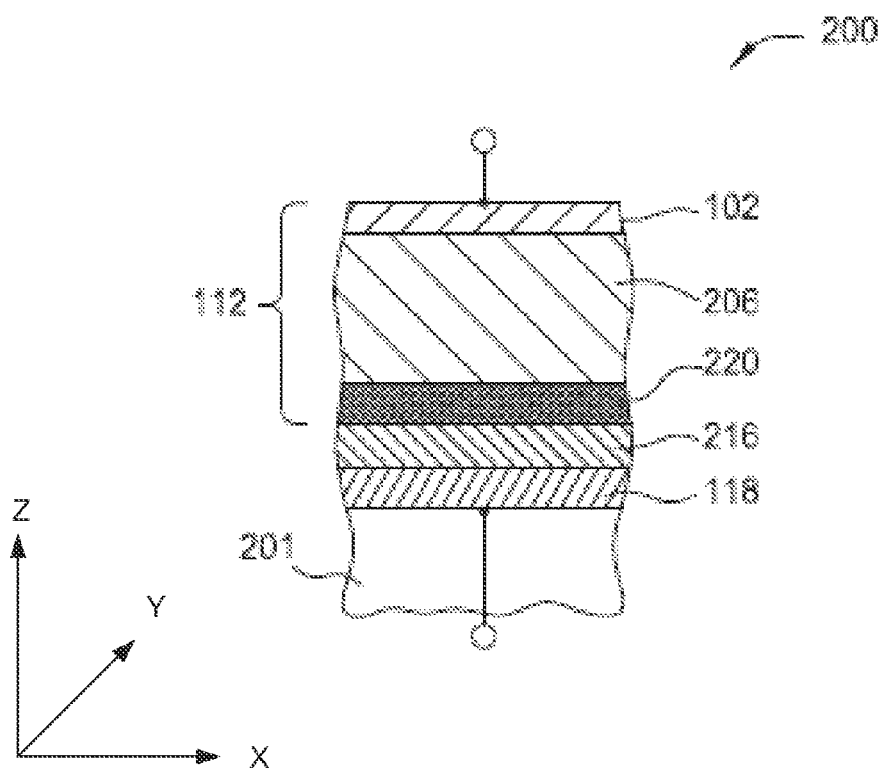
FIG. 3A is a schematic cross-sectional view of a resistive switching memory element in accordance with some embodiments.

Each of the memory cells 200 can be accessed individually using appropriate sets of individual word-lines and bit-lines, which may be used as electrodes 102 and 118. In some embodiments, the resistor structure 220 includes a two-terminal structure that is connected in series with the resistive switching memory element 112 disposed in the memory cell 200, as shown in FIG. 1B. In another aspect, the resistor structure 220 is disposed within the material stack of the resistive switching memory element 112, for example, as shown in FIG. 3A.

FIGS. 2A and 2B illustrate two examples of the memory cell 200. In one embodiment, at least one resistor structure 220 and at least one resistive switching memory element 112 are disposed between the electrodes 102 and 118 within the memory cell 200. In some embodiments, as shown in FIG. 2A, the resistor structure 220 is disposed between the electrode 102 and the resistive switching memory element 112. In some embodiments, as shown in FIG. 2B, the resistor structure 220 is disposed between the resistive switching memory element 112 and the electrode 118. In come embodiments, the resistor structure 220 is disposed within the resistive switching memory element 112 and between electrode 102 and the electrode 118.

As shown in FIG. 2A, the memory cell 200 is generally coupled to a read-and-write circuitry 150 using word-lines and orthogonal bit-lines, which are generally referred herein as the electrodes 102 and 118, and are used to read from or write data into the memory cells 200. Electrodes 102 and 118, bit lines, word lines, and source-lines within the memory arrays and memory cells are typically biased by at least one circuitry, such as the read-and-write circuitry 150. The arrays of the memory cells 200 are generally connected to the read-and-write circuitry 150, which is often located at the periphery of a memory chip. For example, the electrodes 102 and/or 118 can be biased by the read-and-write circuitry 150. In one embodiment, the resistor structure 220 is incorporated into each of the memory cells 200 to control the current flowing therethrough when a voltage pulse is applied by the read-and-write circuitry 150 during the electrical forming process, read process, write process, set operation, reset operation or other switching operations.

Optionally, a current steering element 216 is disposed between the electrodes 102 and 118 of the memory cell 200. A current steering element such as a diode is often used to prevent cross-talk between the interconnected memory cells from affecting the stored data in other memory cells. The diode will only pass limited programming and erasing currents through the resistive switching memory element in desired directions. In some embodiments, the current steering element 216 is an intervening electrical component, such as a p-n junction diode, p-i-n diode, transistor, or other similar device. In one example, the current steering element 216 may include two or more layers of semiconductor material, such as two or more P-doped or N-doped silicon layers, configured to allow or inhibit the current flow through the memory cell 200 in different directions during operation. Alternatively, a high-capacity nonvolatile memory integrated circuit may contain a MOS-type transistor or other types of transistors to regulate current flow.

FIG. 2B is a schematic representation of a memory cell in accordance with some embodiments. The memory cell 200 includes at least one resistive switching memory element 112, the resistor structure 220, and at least one diode-type current steering element (e.g., the current steering element 216) which allows current to flow through the memory cell 200, preferentially in a forward direction ("$I^+$"). Because of the design of the current steering element 216, a reduced current can also flow in the opposing direction through the memory cell 200 by the application of a reverse bias to the electrodes 102 and 118.

FIG. 2C illustrates the current-versus-voltage (I-V) characteristics of a two-terminal resistor structure that can be used in the memory cells 200 described herein. In FIG. 2C, the curve 810 illustrates the I-V characteristics of an exemplary resistor structure 220, as compared to the I-V characteristics of ideal resistors, shown as curves 820 and curve 830. Examples of the materials used to form an exemplary resistor structure 220 are further described below.

In general, it is desirable that the resistor structure 220 exhibits a "non-linear" current-versus-voltage curve (e.g., the curve 810 as shown in FIG. 2C), where the current flowing through the resistor structure 220 is high enough so that it is easily measurable at low voltage levels, such as at $V_{READ}$ levels (e.g., between $V_1$ and $V_2$) during "sensing" operations used to detect the logic state of the memory cell 200, and at least nearly saturated at high voltage levels, such as at the $V_{SET}$ or $V_{RESET}$ programming levels (e.g., between $V_3$ and $V_4$) during "switching" operations.

In some embodiments, the current flowing through the cross section of a 20 nm square resistor structure 220 is measured as 0.4 µA (I=J×Area=4E-7=0.4 (µA)) at a voltage level of about 0.15 volts and at $J=1E5$ A/cm$^2$. A desirable current level can be obtained by adjusting the electrical or physical properties of the material layers of the resistor structure 220, such as increasing the dopant concentration of the resistive materials within the resistor structure 220, to increase free carrier density in the resistor structure or increasing the cross-sectional area of the resistor structure.

As shown in FIG. 2C for a "non-linear" I-V curve (e.g., the curve 810), the resistive properties of the formed resistor structure 220 may cause the current flowing through the memory cell 200 to be dependent on the applied voltage levels in a substantially linear relationship at the low voltage levels (e.g., from $V_1$ to $V_2$, the current is measured at $I_b$ to $I_c$) and flattened out, or saturated, at high voltage levels (e.g., from $V_3$ to $V_4$, the current is measured at a constant level of $I_e$). One will note that, in some configurations, the "non-linear" resistance curve illustrated by the curve 810 in FIG. 2C may not be completely horizontal or flat at high voltage levels (e.g., from $V_3$ to $V_4$).

In contrast, an ideal resistor typically exhibits a linear resistance curve, such as the curves 820 and 830. Typically, metallic types of materials (e.g., hafnium nitride, titanium nitride, tantalum, etc.) will exhibit "linear" I-V characteristics. These types of linear resistors are not suitable or preferred to be incorporated into the memory cell 200 to limit or regulate current flow. An ideal resistor having a linear resistance curve (e.g., the curve 830) will have high resistance (low current) at low voltage levels, and such high resistance is not able to meet specification requirements, even though it can limit the current to a desired value at either the low or high voltage levels. For example, at $V_2$, the current $I_a$ flowing through a memory cell may be too low to be measured (e.g., at $V_2$, $I_a \ll I_c$). If, on the other hand, an ideal resistor having a different resistance curve, such as the curve 820, even though the current level at $V_2$ is measurable at low voltage level (e.g., the curve 820 showed a current level of $I_c$ at $V_2$), at high voltage levels the measured current levels (e.g., $I_f$) is way too high. The I-V characteristics for such an ideal resistor as shown in the curve 820 is not compatible for a memory cell, because at high voltage levels, such as $V_5$, the measured current levels (e.g., $I_f$ or $I_{MAX}$) is much larger than the required compliance current limit, $I_{CC}$. Such a large current (e.g., $I_f$) will damage a memory cell, causing breakdown, generating heat, damaging the material layers used to form the resistive switching memory element, and ultimately reducing effective lifetime. Accordingly, it is desirable to form the resistor structure 220 with its I-V characteristics substantially similar to the curve 810, which includes a low resistance at low current levels and a higher resistance at higher current levels. In one example, the thickness (L) and resistivity ($\rho$) of the formed lightly doped material layer of the resistor structure 220 can be designed and tailored to obtain the measured electrical characteristics as shown in the curve 810. To obtain the resistor structure 220 as described herein with desirable electrical and/or physical properties, one or more steps can be adjusted in a deposition process to form material layers within the resistor structure 220. One skilled in the art will appreciate that the resistance (R) to current flow through a thin film is equal to the resistivity ($\rho$) of the film times the length (L) of the film divided by its cross-sectional area (A), or resistance $R = \rho(L/A)$, where the length "L" is the thickness of the layer as the current flows through the thickness of the layer and the cross-sectional area (A) is measured perpendicular to the current flow direction (e.g., perpendicular to the thickness direction). In some embodiments, the thickness of the resistor structure or one of its component contributing most resistance to the resistor structure (e.g., a non-linear resistive layer) may be less than about 200 Angstroms or, more specifically, less than about 50 Angstroms.

Resistivity ($\rho$) is an intrinsic property of the formed layer that can be adjusted in some cases by adjusting the composition of the layer, such as adding alloying element or doping atoms, or by adjusting the crystalline structure of the layer (e.g., crystal structure). Since the cross-sectional area (A) of the memory cell is generally fixed by the size and lateral spacing of the memory cells 200 formed on a memory chip, and thus is generally not easily varied from one memory cell to the next, thus, the resistance R of the resistor structure 220 can be controlled by the adjustment of the thickness "L" and/or the resistivity ($\rho$) of the non-linear resistive layer 624.

In some embodiment, the resistor structure 220 may exhibit a current-versus-voltage curve that fall under the shaded area "A" shown in FIG. 2C. For example, the I-V curve of the resistor structure 220 may exhibit a curve with different shapes or slopes without deviating from the spirit of the disclosure. The schematic illustration of the curve 810 demonstrating the I-V characteristics of the resistor structure 220 herein is not intended to be limiting as to the scope.

Figure 4:
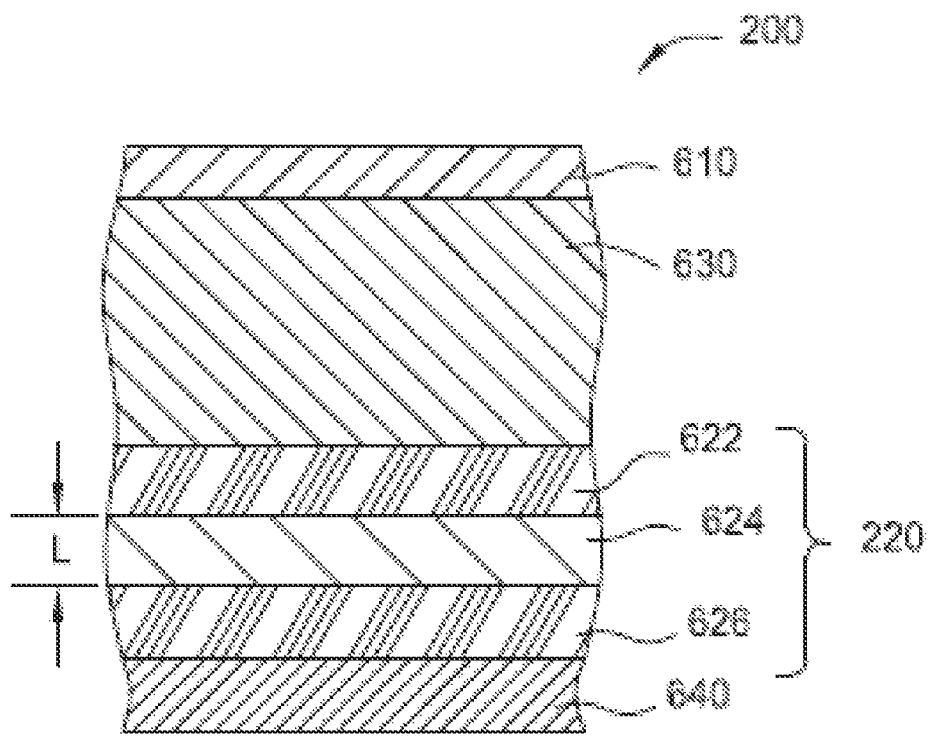
FIG. 4 is a schematic cross-sectional view of a two-terminal resistor structure in accordance with some embodiments.

In some embodiments, the electrical or physical properties of the resistor structure 220 are adjusted such that the I-V characteristics of the resistor structure 220 will exhibit a curve that fall under the shaded area "A" shown in FIG. 2C. Some examples of these changes include changing the materials in forming the resistor structure 220, increasing or decreasing the dopant concentration in the material layers (as shown in FIG. 4) of the resistor structure 220, and changing the thickness "L" of a non-linear resistive layer 624 (as shown in FIG. 4), among others. As a result, appropriate low voltage levels (e.g., between $V_1$ and $V_2$) can be used to apply as $V_{READ}$ sensing pulses and generate an appropriate current flow (e.g., between $I_b$ and $I_c$) during "read" operations. In addition, when high voltages (e.g., between $V_3$ and $V_4$) are applied, the current flowing through a memory cell 200 having the resistor structure 220 is relatively constant at the $I_e$ level, which is measured to be a value much lower $I_{cv}$ (or $I_{MAX}$) such that $V_5$ is suitable to be used as $V_{SET}$, $V_{RESET}$ switching voltages and the measured current values (e.g., the "on", "off" currents at $V_{SET}$, $V_{RESET}$, respectively) stay roughly to the same low current level at $I_e$, where $I_e \ll I_{CC}$ or $I_{MAX}$.

Figure 3B:
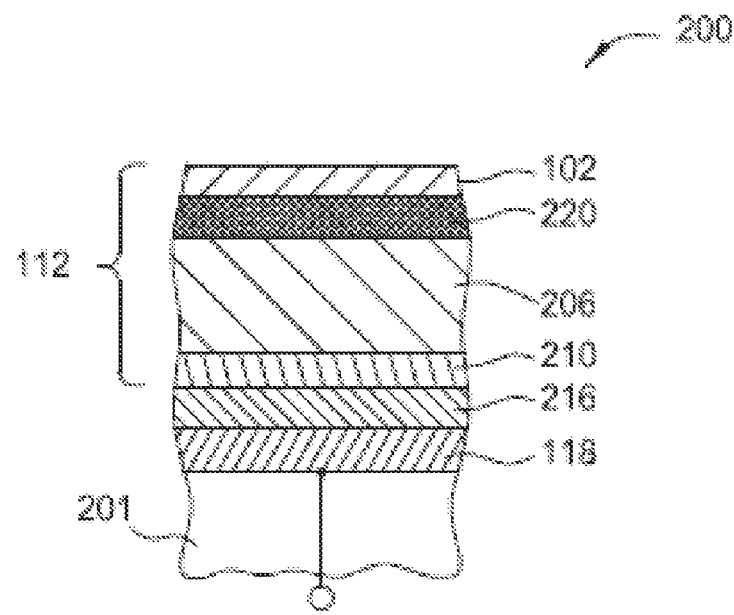
FIG. 3B is a schematic cross-sectional view of a resistive switching memory element in accordance with some embodiments.

FIGS. 3A and 3B illustrate schematic cross-sectional views of two examples of the memory cells 200 having the resistor structure 220 disposed therein. The memory cell 200 is shown to include a top electrode layer (e.g., the electrode 102), the resistive switching memory element 112, the current steering element 216, and a bottom electrode layer (e.g., the electrode 118) formed over a portion of the surface of a substrate 201.

The resistive switching memory element 112 may include a MIM (metal-insulator-metal) stack to offer bistable resistance within the memory cell 200. This stack includes the variable resistance layer 206 containing a dielectric material, such as a metal oxide material or other similar material that can be switched between at least two or more stable resistance states when a predetermined voltage is applied to the layer. The variable resistance layer 206 having the metal oxide insulator material may be disposed between two or more metal conductive layers, for example, a top electrode layer 102 and an intermediate electrode layer 210, thus forming the MIM stack. The variable resistance layer 206 may directly interface one of these conductive layers, e.g., the top electrode layer 102 as shown in FIG. 3A or the intermediate electrode 210 as shown in FIG. 3B. The variable resistance layer 206 may also directly interface the resistor structure 220 as shown in FIGS. 3A and 3B. In this case, the resistor structure 220 is operable as another electrode of the memory cell. In other words, the resistor structure 220 ensures that the resistive switching material of the variable resistance layer 206 is capable of switching between two resistive states.

In some embodiments, the variable resistance layer 206 is separate from the resistor structure 220 by at least one element, e.g., the intermediate electrode 210. In this example, the intermediate electrode 210 electrode may include highly doped polysilicon while the resistor structure 220 may include a lightly doped polysilicon. In some embodiments, this intermediate electrode may be considered a part of the resistor structure. As such, the resistor structure 220 may include multiple layers, one of which may be operable as an electrode. Examples of such resistor structures are further described below with reference to FIG. 4. In some embodiments, the resistor structure 220 includes only one layer formed by a homogeneous material, meaning that there is no variation in the material composition throughout the layer.

For purposes of this document, the stack is defined any combination of layers formed above the substrate. The stack has a height extending in the Z direction. Typically, every layer of the stack extends substantially perpendicular (i.e., normal) to the stack. The Z direction (or the height of the stack) and the X-Y plane (or the plane perpendicular to the height of the stack) shown in FIG. 3A are used to define directional resistivities of various components. For examples, the resistor structure or a component of the resistor structure may have different a resistivity in the Z direction than within the X-Y plane. The electrical current within the stack generally flows in the Z direction and resistivity or, more specifically, resistances of these components are typically important for operation of the memory cell. Various resistivity and resistance descriptions and values presented in this disclosure refer to resistivities and resistances in the Z direction unless specifically noted.

In some embodiments, resistivity of a material forming the resistor structure or one of its components is much smaller in the Z direction than within the X-Y plane. For example, a ratio of these resistivities may be at least 1,000 or even at least about $10^6$. This resistor structure or its specific component having such characteristics may be used as both embedded resistor (for its high resistivity in the Z direction) and a signal line (for its low resistivity within the X-Y plane). When the resistor structure is used as a signal line it extends across multiple different memory cells as, e.g., shown in FIG. 1A (elements 102 and 118). Specifically, the lightly doped material of the resistor structure may have a resistivity of at least 1 Ohm-cm in a direction along the height of the stack and a resistivity of less than 0.001 Ohm-cm within a plane normal to the height of the stack.

In FIG. 3A, the resistive switching memory element 112 includes the top electrode layer 102, the variable resistance layer 206, and the resistor structure 220, deposited on the surface of the substrate 201. In some embodiments, a portion of the resistor structure 220 contains a conductive metal material layer and is deposited on the surface of the substrate 201 as part of the MIM stack of the resistive switching memory element 112 to serve as an electrode layer (e.g., an intermediate electrode layer 210, as illustrated in FIG. 3B). The conductive metal material may include, for example, titanium nitride, titanium, tantalum, tantalum nitride, tungsten, aluminum, among others. In some embodiments, the variable resistance layer 206 is disposed between the top electrode layer 102 and the resistor structure 220, and the MIM stack is formed.

In FIG. 3B, the memory cell 200 includes the top electrode layer 102, the resistor structure 220, the variable resistance layer 206, the intermediate electrode layer 210, the current steering element 216, and the bottom electrode layer 118, disposed over a portion of the substrate 201. Accordingly, the variable resistance layer 206 is disposed between the top electrode layer 102 and the intermediate electrode layer 210, thus forming the MIM stack and the resistor structure 220 can be disposed between the intermediate electrode layer and the current steering element 216. In some embodiments, the resistor structure 220 may be disposed between the top electrode layer 102 and the variable resistance layer 206. In some embodiment, the variable resistance layer 206 is disposed between the resistor structure 220 and the intermediate electrode layer 210, as part of the MIM stack of the resistive switching memory element 112. The top electrode layer 102, the intermediate electrode layer 210, and the bottom electrode layer 118 are generally formed from a conductive material, such as a highly conductive semiconductor material (e.g., p-type polysilicon, n-type polysilicon) and/or a conductive metal material, e.g., titanium nitride (TiN), aluminum (Al), tungsten (W), among others, to minimize the circuit resistance created between the interconnected memory cells in the memory device 100.

As shown in FIGS. 3A and 3B, the resistor structure 220 may be disposed within the film stack of the resistive switching memory element 112. In some embodiments, the resistor structure 220 is disposed in series with the resistive switching memory element 112. For example, the resistor structure 220 may be disposed between the intermediate electrode layer 210 and the current steering element 216. As another example, the resistor structure 220 may be disposed between the resistive switching memory element 112 and the current steering element 216. Alternatively, the resistor structure 220 may be disposed between the current steering element 216 and the bottom electrode layer 118. As still another example, the resistor structure 220 may be disposed between the current steering element 216 and the surface of the substrate 201. The resistor structure 220 may or may not directly interface any of these other components of the memory cell 200.

The current limiting component, such as the resistor structure 220, of the memory cell 200 is configured to improve the switching performance and lifetime. In one embodiment, the resistor structure 220 is disposed within the memory cell 200 to be close to the variable resistance layer 206 and/or the current steering element 216 to effectively limit or prevent currents delivered through the memory cell 200 from damaging the various layers formed therein when applying the propagating "programming" current pulses (e.g., "set" or "reset" pulses) during normal "read" or "write" operations.

In some embodiments, the current steering element 216 includes a p-n junction diode, p-i-n diode, transistor, or other similar device that is disposed between the bottom electrode layer 118 and the resistive switching memory element 112. Alternatively, the current steering element 216 can also be disposed between the top electrode layer 102 and the resistive switching memory element 112. In one example, the current steering element 216 may include two or more layers of a semiconductor material, such as two or more doped silicon layers, that are configured to direct the flow of current through the memory cell. In one example, the current steering element is a diode that includes a p-doped silicon layer (not shown), an un-doped intrinsic layer (not shown), and an n-doped silicon layer (not shown) that has an overall resistance between about 1 kΩ and about 100 MΩ. The overall resistance will generally depend on the type of current steering element 216 that is formed and in what direction current is flowing through the memory cell (e.g., forward or reversed biased).

FIG. 4 illustrates schematically an exemplary resistor structure 220 disposed in a portion of the memory cell 200 in accordance with some embodiments. The memory cell 200 may be, for example, a memory cell 600, which includes an electrode layer 610, the resistor structure 220, a variable resistance layer 630, and/or an electrode layer 640.

The resistor structure 220 may include a first material layer 622, a non-linear resistive layer 624 and a second material layer 626. The non-linear resistive layer 624 may be formed from a dielectric material (e.g., silicon-containing materials, germanium-containing materials, gallium arsenic-containing materials, and other Groups III-V materials). These dielectric materials may be doped as described above. In some embodiments, the current flowing through the resistor structure 220 can be achieved by forming a series of heavily doped and lightly doped polysilicon material layers to form an $N^+/N^-/N^+$ stack or a $P^+P^-/P^+$ stack. Other materials, such as germanium (Ge)— containing semiconductor materials, gallium arsenic, Group III-V materials, among others, can also be used to form the heavily doped or the lightly doped material layers within the resistor structure 220. In some embodiments, one or both of layers 622 and 624 may be operable as electrode and assist the resistive switching material of the variable resistance layer 630 with capable of switching between two resistive states upon application of a predetermined voltage to this layer. For example, one or both layer 622 and 624 may include highly-doped polysilicon, while layer 624 includes lightly doped polysilicon.

In some embodiments, one or both layers 622 and 624 may be made from diffusion barrier materials, such as titanium nitride, tantalum nitride, indium oxide, copper silicide, or tungsten nitride. Such layers prevent changes in composition of layer 624 during fabrication and operation of memory cell 200. In some embodiments, a memory cell includes an intermediate electrode and a diffusion barrier layer between its non-linear resistive layer and variable resistance layer. The intermediate electrode and/or the diffusion barrier layer may be a part of the resistor structure or may be separate elements.

Returning to FIG. 4, the resistor structure 220 may additionally include one or more conductive metal material layers which are coupled to the first material layer 622 and the second material layer 626 in order to provide good electrical contact with other material layers on its two terminals. For example, the resistor structure 220 may include a first conductive metal material layer disposed between the variable resistance layer 630 and the first material layer 622 (not shown in FIG. 4). In some embodiments, the resistor structure 220 may include a conductive layer disposed between the second material layer 626 and an electrode layer (e.g., the electrode 102, 118, 210 610, 640 as shown in FIGS. 1A-1B, 2A-2B, 3A-3B, 4). In one embodiment, these structures and material layers are disposed horizontally, vertically, or in other directions and interconnected to form the memory device 100.

As illustrated in FIG. 4, the variable resistance layer 630 is disposed between the electrode layer 610 and the resistor structure 220. Alternatively, the variable resistance layer 630 can be disposed between the electrode layer 640 and the resistor structure 220. The electrode layers 610, 640 may be the top electrode 102, the bottom electrode 118, and the intermediate electrode layer 210 (as shown in FIGS. 1A-1B, 2A-2B, 3A-3B, 4), among others.

The resistor structure 220 includes a resistive material, such as resistive metals, doped semiconductors, and conductive dielectric materials that can be reliably and consistently formed in a suitable size within the memory cell 200. In some embodiments (when the resistor structure 220 directly interfaces the variable resistance layer), a material from which the resistor structure 220 is formed has a desirable work function to better control the electron flow between the resistor structure 220 and the variable resistance layer 206. In this case, by selecting and forming the material layers of the resistor structure 220 that have a desirable work function and are disposed adjacent to the variable resistance layer 206, the magnitude of the required $I_{ON}$ and $I_{OFF}$ currents can be adjusted due the desired barrier height formed at the interface between layers.

The resistor structure 220 can be configured to have a two-terminal electron source and drain that has no energy barrier for the injection of electrons into the non-linear resistive layer 624. For example, the first material layer 622 and the second material layer 626 incorporated onto the two sides of the non-linear resistive layer 624 may serve as the no energy barrier source and drain regions. In some embodiments of the resistive switching memory element 112, the resistor structure 220 is used to increase or decrease the formed barrier height at the interface between the resistor structure 220 and the variable resistance layer 206 to adjust the ease with which current will flow through the formed interface in the formed memory cell when a voltage is applied across the electrodes. An increased barrier height will thus tend to reduce the magnitude of the $I_{ON}$ and $I_{OFF}$ current that will flow through the memory cell during operation, due to the increased energy required to move the electrons over and/or tunnel through the barrier and allow the current to flow through the memory cell. One will note that the increase in barrier height will generally not affect the current ratio ($I_{ON}/I_{OFF}$), and thus not affect one's ability to detect the different logic states in the memory cell.

It is believed that the first material layer 622 and the second material layer 626 may act as electron source and drain. For example, when the lightly doped non-linear resistive layer 624 is an $N^-$ layer, the first and the second material layers can be heavily doped $N^+$ layers to act as source and drain regions (e.g., the first material layer 622 can be the source region and the second material layer 626 can be the drain region). In one example, the voltage level of the drain region is relative (e.g., +2 Volts) to the source region. The source $N^+$ region injects electrons into the $N^-$ polysilicon material and the electron injection is accelerated to a saturation velocity, $v_{sat}$, by the electrical field set up between the source and drain regions. The injected electrons are collected by the drain region. In addition to act as electron source and drain regions, the first and the second material layers 622, 626 of the resistor structure 220 also need to ensure good electrical contact to layers above and below the lightly doped non-linear resistive layer 624. One skilled in the art could understand that lightly doped material layer, the first and the second material layer described here can be biased in either direction to act as the source and drain regions.

In some embodiments, the resistive switching memory elements 112 in each memory cell 200 is a bistable memory element having two stable resistance states, which may include a high resistance state (HRS) and a low resistance state (LRS). The switching between these resistance states and determination of the current resistance state is performed by applying suitable voltages to the element. As an example, the high and low resistance states of the variable resistance layer 206 may be about 2.5 MΩ and about 100 kΩ, respectively. The resistive switching memory element 112 of the memory device 100 use bipolar switching, which uses set and reset voltages ($V_{SET}$ and $V_{RESET}$) having opposite polarities to alter the resistance of the resistive switching memory element 112 between the high and low resistance states.

Figure 5:
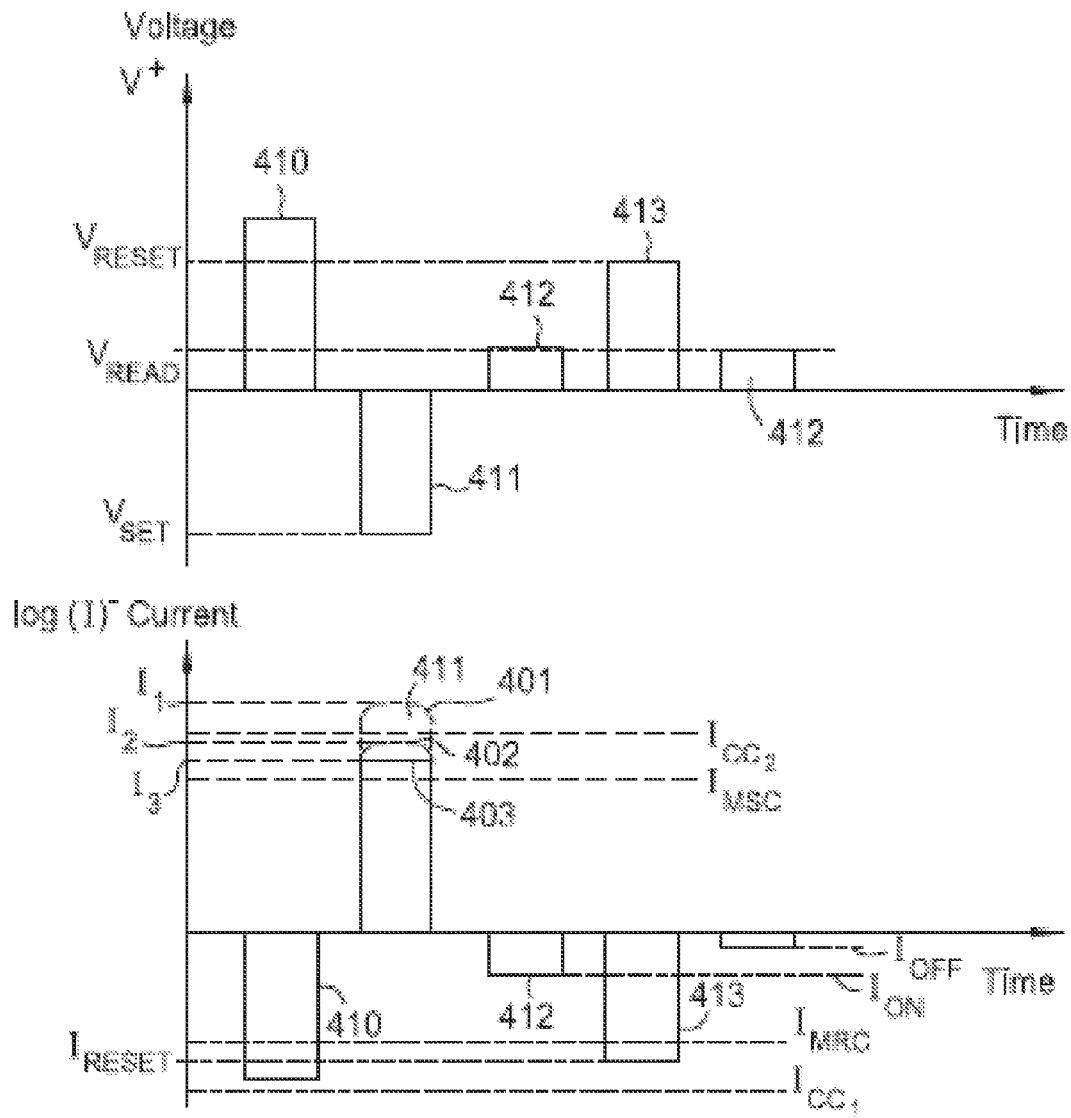
FIG. 5 illustrates the process of delivering switching pulses through a bipolar type resistive switching memory element, in accordance with some embodiments.

FIG. 5 illustrates the delivery of a plurality of bipolar type "set" and "reset" voltage pulses to a memory cell and the resulting currents that flow through the memory cell, in accordance with some embodiments. The top portion of FIG. 5 is a plot of voltage pulses versus time, showing the voltage levels for pulses 410, 411, 401, 402, 403, 412, and 413, and the bottom portion is a plot of the resulting current levels (in log scale and in reverse direction, negative current on top) versus time, each current level corresponding to an applied voltage pulse 410, 411, 401, 402, 403, 412, and 413.

In general, it is desirable to prepare the resistive switching memory element 112 of a memory cell 200 prior to "switching" operations. For example, during an initial start-up stage to prepare the resistive switching memory element 112, it is common to apply a forming voltage ($V_{FORM}$) at least once across the electrodes 102 and 118 to "burn-in" the memory cell 200, prior to the programming of the memory cell 200 through a number of "read" and "write" operations. A "forming" step, stage, or operation may include the delivery of a "forming" pulse 410 to initially burn-in the memory cell 200. The "forming" pulse 410 is usually a positive forming voltage, $V_{FORM}$, at an applied voltage level in the range between +3 volts and +7 volts, applied to the memory cell 200 for a period of time. Applying the forming pulse generally breaks down and/or re-aligns vacancies or defects in the materials within the memory cell 200. It is believed that the application of a forming voltage, which is typically significantly greater than the $V_{RESET}$ and $V_{SET}$ voltages, causes the defects that are formed within the variable resistance layer 206 during the fabrication process to move, align and/or collect within various regions of the formed variable resistance layer 206, causing the variable resistance layer 206 to consistently and reliably switch between the "on" and "off" resistive states throughout the life of the resistive switching memory element 112.

The resistor structure 220 integrated in the memory cell 200 may lower the forming current flowing through the memory cell 200 when the forming pulse is applied, such that the forming current is designed to be able to fall under a compliance current, $I_{CC1}$, which is required by the manufacturer's specifications. A low forming current flowing through the cell 200 may prevent damage to the memory cell 200 caused by the forming pulses during a forming process. In some embodiments, the forming voltage is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. For example, the forming voltage can be applied at between about 3 volts and about 7 volts. However, it is noted that in some cases it is desirable to form the resistive switching memory element 112 so that the application of a forming voltage is not required at all to assure that the memory cell will perform as desired throughout its life.

Next, as shown in the top portion of FIG. 5, to program the memory cell 200, a "write" operation (e.g., a "switching" operation) may be performed by the delivery of a "set" switching pulse 411 (e.g., at a "set" voltage level, $V_{SET}$, which is often a negative voltage in the range between −2 Volts and −4 Volts), or a "reset" switching pulse 413 (e.g., at a $V_{RESET}$ voltage level, which is often a positive voltage in the range between +2 Volts and −5 Volts), to an appropriate set of the electrodes 102 and 118. The delivery of the "set" switching pulse 411 to the memory cell sets the resistive switching memory element 112 into a low resistance state (LRS) (e.g., a logic "one" state), and the delivery of the "reset" switching pulse 413 to the memory cell resets the resistive switching memory element 112 into a high resistance state (HRS) (e.g., a logic "zero" state). In addition, a "read" operation may be performed before or after each "write" or "switching" operation and may include the delivery of a "sensing" pulse 412 at a sensing voltage level (e.g., a "read" voltage level, $V_{READ}$, such as about +0.5 volts (V) or other suitable voltage levels), prior to or after the delivery of each "set" switching pulse 411 or "reset" switching pulse 413, to sense the resistance state of the resistive switching memory element 112 in the memory cell 200.

Accordingly, a plurality of the voltage pulses 411, 412, 413 can be applied for a period of time to switch and sense the resistance states of the resistive switching memory element 112 during the programming and sensing operations of the memory cell 200. For example, a square or trapezoidal shaped pulse for a period of about 1 microseconds (ms) to about 1 nanoseconds (ns) can be used to switch the resistive switching memory element 112. In some embodiments, it may be desirable to adjust the length of each pulse, depending on the amount of time needed to switch the resistive switching memory element 112. For example, the "set" and "reset" pulses may each be about 10 nanoseconds (ns) in length.

To assure that the resistive switching memory element 112 reliably switches from a high resistance state to a low resistance state and vice versa, one must assure that the "set" switching pulse 411 produces a current that is greater than a minimum "set" current, $I_{MSC}$, which is defined as the minimum current required to flow through the variable resistance layer 206 of the resistive switching memory element 112 to cause it to switch from a high resistance state (HRS) to a low resistance state (LRS) (e.g., <<250 kΩ). In addition, to assure that the resistive switching memory element 112 reliably switches from a low resistance state (LRS) to a high resistance state (HRS) (e.g., about 2.5 MΩ or above), the "reset" switching pulse 413 is generally delivered at a voltage level that causes a current to flow at a current level that is greater than a minimum "reset" current, $I_{MRC}$, which is defined as the minimum current required to flow through the variable resistance layer 206 to cause it to switch from a low resistance state to a high resistance state. It should be noted that the minimum "set" current, $I_{MSC}$, and the minimum "reset" current, $I_{MRC}$, are related to the physical and/or electrical properties of the material within the variable resistance layer 206.

In operation, the state of a resistive switching memory element in a memory cell can be sensed and changed into a desired logic "one" or "zero" state for binary-bit data storage. For example, the resistive switching memory element 112 of the memory cell 200 may be in an initial high resistance state (HRS) (e.g., a logic "zero" state) and the resulting "Off" current ($I_{OFF}$) flowing through the resistive switching memory element 112 can be sensed. When it is desired to store a logic "one" in the memory cell 200, the "set" switching pulse 411, which is usually in opposite polarity of the "sensing" pulse 412, may then be applied to place the resistive switching memory elements 112 into its low resistance state (LRS, "On" state). The resulting "On" current ($I_{ON}$) flowing through the resistive switching memory element 112 can be sensed by applying the "sensing" pulse 412 at the "read" voltage level, $V_{READ}$, to the resistive switching memory element 112.

As another example, a resistive switching memory element may initially be in a low resistance state (LRS) (e.g., a logic "one" state). When it is desired to store a logic "zero" in the memory cell 200, the "reset" switching pulse 413, which is usually in opposite polarity of the "sensing" pulse 412, may then be applied to place the resistive switching memory elements 112 into its high resistance state (HRS, "Off" state). When the "reset" switching pulse 413 at the reset voltage level, $V_{RESET}$, is removed, the resistive switching memory element 112 can once again be characterized as in its high resistance state (HRS, or "Off" state) when another "sensing" pulse at the read voltage level, $V_{READ}$, is applied and the resulting "Off" current ($I_{OFF}$) flowing through the resistive switching memory element 112 is sensed.

To provide a measurable difference between the logic "zero" and logic "one" states, it is common to form the variable resistance layer 206 and other components of the resistive switching memory element 112 so that the ratio of the $I_{ON}$ current to the $I_{OFF}$ current ($I_{ON}/O_{OFF}$) is from about 5× to about 20×, such as at about 10× or according to specifications. In other words, the ratio of the electrical resistances of the variable resistance layer 206 is decreased by at least 10 times when switching between the high and the low resistance states. The change in the resistance state of resistive switching memory element 112 may be due to the redistribution or filling of traps (i.e., "trap-mediated"), or defects, in a resistive material layer with variable resistance, (e.g., the variable resistance layer 206 in FIGS. 3A and 3B), when the memory cell 200 is reverse biased. The defects or traps are commonly formed during the deposition, initial burn-in, or forming of the variable resistance layer 206, and these defects or traps are often created by a non-stoichiometric material composition found in the formed variable resistance layer 206. In turn, the overall resistance of the resistive switching memory element 112 determines what digital data is being stored by the memory cell 200.

Figure 6:
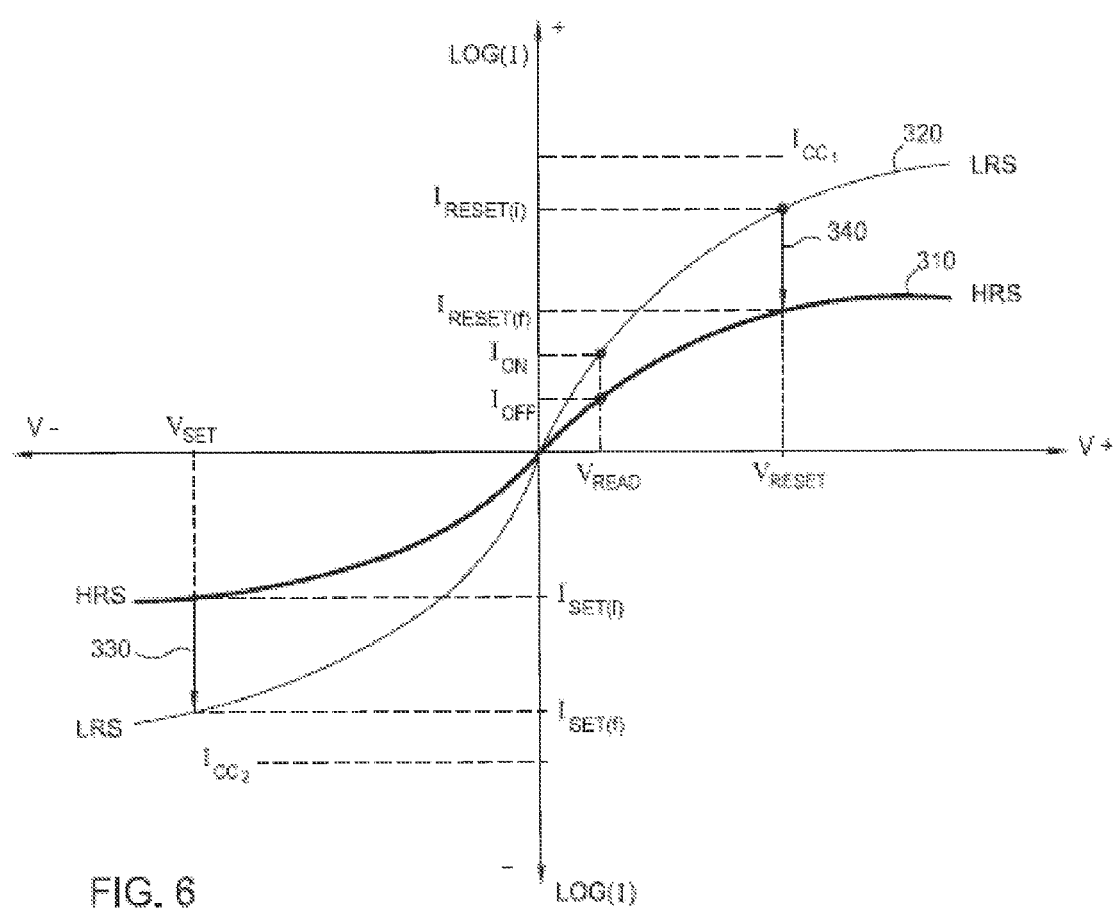
FIG. 6 is a graph illustrating the current (I) versus voltage (V) characteristics of a bipolar type resistive switching memory element for both "On" and "Off" states, in accordance with some embodiments.

FIG. 6 illustrates an exemplary log-log plot of measured currents (I) versus applied voltages (V) of an exemplary memory cell having a resistive switching memory element 112. While the discussion of the resistive switching memory element 112 herein primarily provides bipolar switching examples, some embodiments of the resistive switching memory element 112 may use unipolar switching, where the set and reset voltages have the same polarity.

The resistive switching memory element 112 of the exemplary memory cell 200 may include, for example, a first electrode layer of about 10 Å of n+ polysilicon, a variable resistance layer of about 30 Å of hafnium oxide ($Hf_xO_y$), and a second electrode layer of about 10 Å of titanium nitride (TiN). The resistive switching memory element may be placed in two stable resistance states, a low-resistance-state (LRS), following the I-V curve of a LRS curve 320, or a high-resistance-state (HRS), following the I-V curve of a HRS curve 310.

In general, by sweeping the voltage applied to the electrodes 102 and 118 between two applied voltages (e.g., between the programming voltages, or $V_{SET}$ (e.g., −3 volts) and $V_{RESET}$ (e.g., +4 volts)), while the memory cell is in the low resistance state, the LRS curve 320 can be created. On the other hand, by sweeping the voltage applied to the electrode layers 102 and 118 between two applied voltages (e.g., between $V_{SET}$ and $V_{RESET}$) while the cell is in the high resistance state, the HRS curve 310 can be created. Accordingly, the resistive switching memory element 112 of the exemplary memory cell may either be in a high resistance state (HRS) or a low resistance state (LRS). The resistive switching memory elements 112 within a memory cell can be selectively chosen by the read-and-write circuitry 150 to switch between its resistance states. The current steering element 216 is used to regulate (e.g., allow or inhibit, etc.) the currents flowing through only the desired memory elements when the appropriate set of word-lines and bit-lines and/or electrodes are selected.

During a "set" operation, because of the physical and electrical characteristics of the variable resistance layer 206, the resistive switching memory element of the memory cell 200 can switch from the HRS to the LRS (e.g., following the path of an arrow 330), when a "set" switching pulse (e.g., a pulse at $V_{SET}$ voltage level) is applied and delivered through the memory cell. By applying the "set" switching pulse to the memory cell, the current flowing through the memory cell can shift from the initial "set" current level, $I_{SET(i)}$, to the final "set" current level, $I_{SET(f)}$, according to the arrow 330, due to the change in the resistance of the variable resistance layer 206. In one example, as shown in FIG. 5, the initial "set" current for the memory cell 200 is close to the minimum "set" current $I_{MSC}$, and its magnitude is smaller than a "set" compliance current (e.g., $I_{CC1}$, generally required by specifications).

In addition, during a "reset" operation, the variable resistance layer 206 of the resistive switching memory element can function to switch from the LRS to the HRS (e.g., following the path of an arrow 340), when a "reset" switching pulse (e.g., a pulse at $V_{RESET}$ voltage level) is delivered to the memory cell. The current flowing through the memory cell can shift from the initial "reset" current level, $I_{RESET(i)}$, to the final "reset" current level, $I_{RESET(f)}$, due to the change in the resistance of the variable resistance layer 206. In one example, as shown in FIG. 5, the initial "reset" current is close to the minimum "reset" current $I_{MRC}$, and its magnitude is smaller than a "reset" compliance current (e.g., $I_{CC2}$, generally required by specifications).

Referring back to FIG. 5, according to some embodiments, to "set" the memory cell 200 in a low resistance state (LRS) or logic "one" state, the read-and-write circuitry 150 applies the "set" switching pulse 411 (e.g., the pulse 402 at a "set" voltage $V_{SET}$ level) across the electrodes 102, 118. A set current, $I_{SET}$ (or $I_2$, as shown in the bottom portion of FIG. 5), is thus created to flow through the memory cell 200 due to the application of the "set" voltage, $V_{SET}$, and the impedance of the components in the memory cell 200. Because the impedances of other material layers are generally much smaller than the impedances of the current steering element 216 and the resistor structure 220, the "set" current, $I_{SET}$ or $I_2$, of the memory cell 200 equals the $V_{SET}$ voltage divided by the sum of the impedances of the current steering element 216 and the resistor structure 220 (i.e., $R_{RS}+R_{CSE}$).

$$I_{SET**}=I_2=\sim V_{SET}/(R_{RS}R_{CSE})$$

As a comparison, applying the "set" switching pulse 411 (e.g., the pulse 401 at "set" voltage $V_{SET}$ level) to a conventional memory cell results in a "set" current, $I_1$, (as shown in the bottom portion of FIG. 5) flowing therethrough. Since the impedance of the current steering element generally dominates the circuit of a conventional memory cell when a set switching pulse is applied, the "set" current, $I_{SET\ conventional}$ or $I_1$, equals the $V_{SET}$ voltage divided by the impedance of the current steering element 216 in the conventional memory cell.

$$I_{SET\ conventional}=I_1=\sim V_{SET}/(R_{CSE})$$

Typically the resistance ($R_{CSE}$) of an undamaged reverse biased diode type current steering element, for example, may be in a range between about 1 and about 100 mega-ohms (MΩ), while the resistance of a forward biased diode type current steering element may be between about 1 and about 20 kilo-ohms (kΩ). As a result, the magnitude of the resulting "set" current $I_1$ created by the pulse 401 becomes very close to the maximum load current ($I_{MAX}$) and is not acceptable because it exceeds the level of a set compliance current, $I_{CC2}$, as required by specification.

$$I_{SET\ conventional}=I_1=\sim V_{SET}/(R_{CSE})>>I_{CC2}$$

It has been found that the high currents delivered through a conventional memory cell can permanently damage the memory element components and cause cross-talk to occur between adjacently connected memory cells. Thus, the magnitude of the "set" current, $I_{SET}$, is particularly important for a bipolar switching cell. The act of driving a high current through the current steering element 216, in a non-forward direction, can breakdown, generate heat within, and ultimately damage the material layers used to form the current steering element and the resistive switching memory element. Thus, reducing the effective lifetime of the current steering element and/or the resistive switching memory element.

Because of the presence of the added impedance ($R_{RS}$) of the resistor structure 220, the maximum current, $I_{MAX}$ ($I_{MAX}=I_{SET**}=I_2$) in the memory cell 200 is thus designed to be smaller than the maximum current of a conventional memory cell, $I_{MAX}=I_1$ where there is only the impedance of the current steering element 216 within such conventional memory cell.

$$I_{SET}=I_2=I_{MAX}<<I_{CC1}<<I_1=I_{MAX}=I_L=\sim V_{SET}/R_{CSE}$$

In addition, it has been found that the magnitude of the current required to "reset" a resistive switching memory element from a low resistance state to a high resistance state is dependent on the magnitude of the current used to "set" the memory cell in the low resistance state. If a high "set" current, such as current $I_1$, is delivered to the resistive switching memory element, then a higher "reset" current is required to achieve a desirable high resistance state. Stated another way, the difference between the "reset" current $I_{RESET}$ and the minimum "reset" current $I_{MRC}$ current ($I_{RESET}>I_{MRC}$) needs to be larger than necessary to cause the resistive switching memory element to switch from the "on" to the "off" state if the magnitude of the applied "set" current is too far from the minimum "set" current $I_{MSC}$ ($I_{SET}=I_1>>I_{MSC}$). The larger than necessary swings in the current used to switch between the "On" and "Off" states can damage the materials and components in the memory cell, thus affecting the memory element's lifetime and reliability.

It is thus desirable to have the resistor structure 220 integrated in the memory cell 200 such that the "reset" current $I_{RESET}$ for the memory cell 200 equals the following: $I_{RESET}=\sim V_{RESET}/(R_{CSE}+R_{RS})$ Incorporating the resistor structure 220 into the memory cell 200 to function together with the resistive switching memory element 112 can help reduce the apparent minimum setting current, $I_{MSC}$, required to cause the variable resistance layer 206 to change to a low resistance state. This is because the addition of the impedance of the resistor structure 220 ($R_{RS}$) in the circuit will reduce the swing in current levels between the "set" and "reset" switching currents at the same fixed applied voltage, thus affecting the density and movement of the traps in the variable resistance layer 206 of the resistive switching memory element 112. Not intending to be bound by theory, but it is believed that when a smaller "On" state switching current is applied to a memory cell, the formed filament(s) or aligned traps in the variable resistance layer will be smaller in size than if a higher "on" current is applied, thus making the filament(s) easier to alter during the "reset" phase of the resistive switching process.

In general, it is desirable to adjust the electrical properties of the integrated resistor structure 220 (e.g., by adjusting its thickness or resistivity) so that its impedance (e.g., $R_{RS}$) effectively limits the current flowing through the resistive switching memory element 112 to a value (e.g., the current, $I_3$, as shown in FIG. 5) that is just greater than the minimum "set" current, $I_{MSC**}$, of the memory cell 200, as illustrated by the pulse 403, and still allow the logic "one" state to be reliably "set" by the applied $V_{SET}$ voltage.

In one embodiment, the magnitude of a maximum current, $I_{MAX}$, through the memory cell 200 is adjusted by the selection of the resistivity ($\rho$) and the thickness (L) of the lightly doped material layer, in relation to the size of the memory cell 200. In general, the maximum current per unit area through the resistor structure 220 is given by $I_{MAX}=nqv_s$, where n is the free carrier density through the lightly doped layer, q is the charge of an electron, and $v_s$ is the saturation velocity of the electrons. In one example, the current may be adjusted by adjusting the thickness of a lightly doped $N^-$ layer. As an example, for a memory cell 200 with 10 nm×10 nm area, a thickness (L) of about 200 angstroms of a lightly doped polysilicon $N^-$ region with a dopant concentration of approximately $1E16$ atoms/cm$^3$ is sufficient to provide the necessary resistance to control the current flowing through the memory cell 200. As the size of the memory cell 200 increases, the resistivity ($\rho$) and thickness (L) of the lightly doped material layer may need to be increased as well. Conversely as the size of the memory cell 200 decreases, the resistivity and/or thickness of the lightly doped material layer may need to be reduced. Most likely, in order to reduce the aspect ratio of the overall material stack within a memory cell, the thickness of the material layers within the resistor structure 220 can be advantageously reduced.

In some embodiments, the total resistance of the resistor structure 220 is between about 10 KΩ and about 600 KΩ, such as between about 100 KΩ and about 400 KΩ. In some embodiments, as shown in FIG. 4, the resistor structure 220 is formed vertically such that it can be placed in series with the resistive switching memory element 112. A desirable resistor structure is one where the current flowing through the memory cell becomes self-limiting to a maximum value $I_{MAX**}$ at a voltage that is higher than necessary to switch the resistive switching memory element 112.

The memory cell 200, having the resistor structure 220, is different from conventional memory cells in that its current-versus-voltage characteristics exhibit a non-linear portion (e.g., the curve 810 as shown in FIG. 2C) due to the addition of the resistor structure 220, instead of a purely linear I-V curve (e.g., the curves 820 and 830 as shown in FIG. 2C) typically found for most resistive switching materials. For example, the currents flowing through the memory cell 200 are dependent on applied voltages delivered at low applied voltage levels due to the low resistance of the formed resistor structure 220, and the currents reach a saturation level regardless of voltages applied at high applied voltage levels due to the presence of high impedance of the resistor structure 220. For example, the resistor structure 220 may have a resistance between 10 KΩ and about 50 KΩ at low applied voltages (e.g., a voltage level of between 0.2V and 0.5 V) and a resistance between about 100 KΩ and about 400 KΩ when a high voltage level (e.g., a voltage level of 0.5V or higher) is applied so that the current (e.g., $I_{MAX**}$) is saturated to be less than 10 μA, a value much lower than the current flow for conventional memory cells at such high voltage level.

In the memory cell 200 that has the resistive switching memory element 112 in a low resistance state (LRS), the $I_{ON}$ current of the memory cell 200 when the "sensing" pulse 412 is applied may approximately equal the $V_{READ}$ voltage divided by the impedance of the current steering element 216 and the impedance of the resistor structure 220. $I_{ON}=\sim V_{READ}/(R_{CSE}+R_{RS})$ For comparison, a conventional memory cell that has the resistive switching memory element 112 in a low resistance state, the $I_{ON}$ current will approximately equal to the $V_{READ}$ voltage divided by the impedance of the current steering element. Thus, the presence of the resistor structure 220 reduces the magnitude of the current after the "set" operation. ($I_{ON}<<I_{ON\ conventional}$). $I_{ON\ conventional}=\sim V_{READ}/R_{CSE}$ In the memory cell 200 that has the resistive switching memory element 112 in a high resistance state (HRS), the $I_{OFF}$ current of the memory cell 200 when the "sensing" pulse 412 is applied may approximately equal the $V_{READ}$ voltage divided by the sum of the impedances of the current steering element ($R_{CSE}$), the impedance resistance of the variable resistance layer ($R_{VR}$), and the impedance resistance of the resistor structure 220 ($R_{RS}$). Therefore, in one example, the $I_{OFF**}$ current for the memory cell 200 is as follows:

$$I_{OFF**} = \sim V_{READ}/(R_{CSE} + R_{RS} + R_{VR})$$

For comparison, a conventional memory cell that has the resistive switching memory element 112 in a high resistance state, the $I_{OFF}$ current will approximately equal to the $V_{READ}$ voltage divided by the impedances of the variable resistance layer ($R_{VR}$) and the current steering element ($R_{CSE}$). Thus, the presence of the resistor structure 220 reduces the magnitude of the current after the "reset" operation. ($I_{OFF**} \ll I_{OFF\ conventional}$).

$$I_{OFF\ conventional} = \sim V_{READ}/(R_{CSE} + R_{VR})$$

Figure 7:
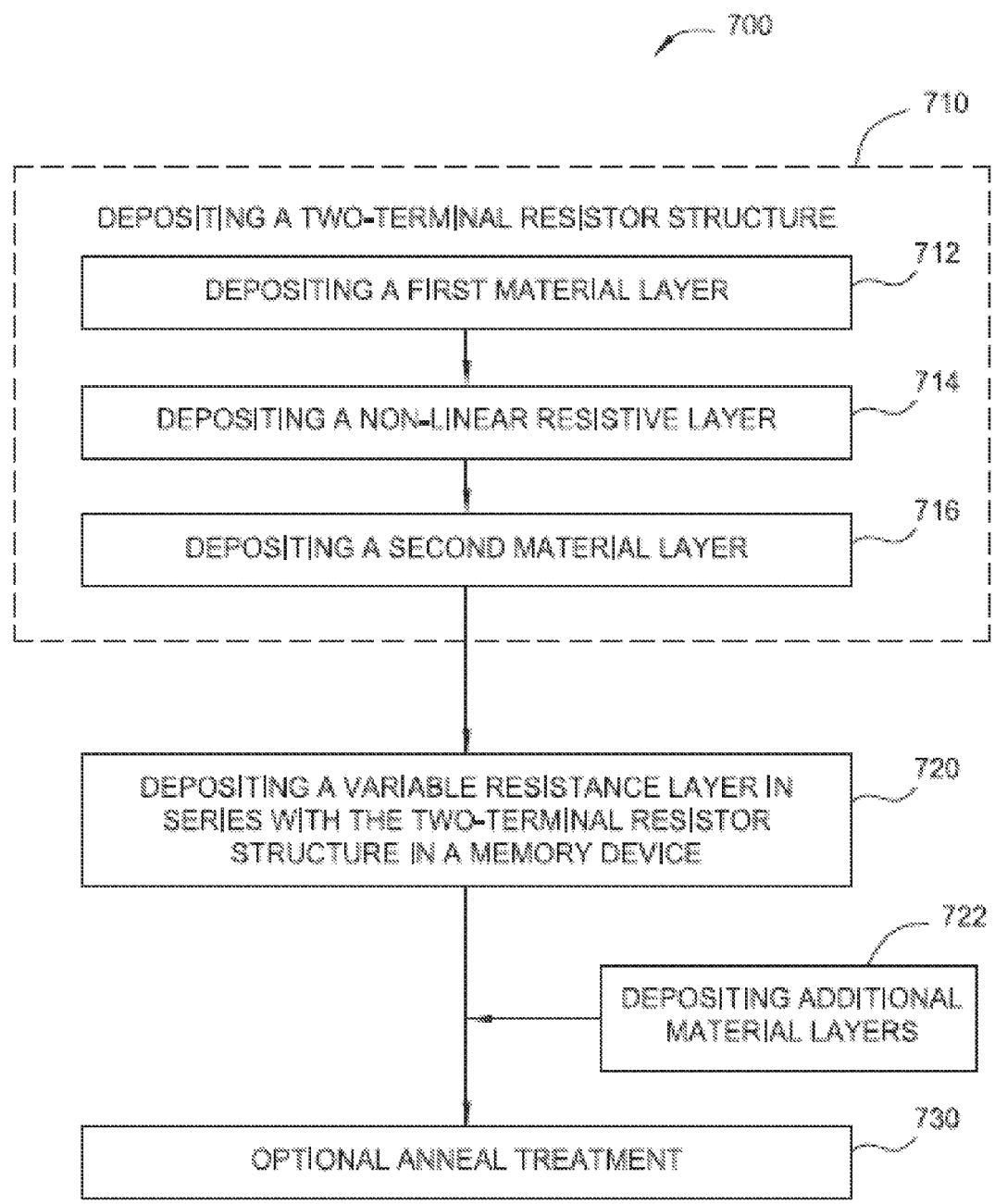
FIG. 7 is a schematic depiction of a process for forming the memory cell according to some embodiments.

FIG. 7 illustrates a process sequence 700 that can be used to form the memory cell 200 (e.g., as shown in FIGS. 1A-1B, 2A-2B, 3A-3B, 4), according to some embodiments. At step 710, the resistor structure 220 is formed over a surface of a substrate 201, wherein the resistor structure 220 includes a two-terminal structure having the first material layer 622, the non-linear resistive layer 624, and the second material layer 626. In general, one or more material layers used to form the memory cell 200, 600 is formed over, or integrated with and distributed over, a portion of the surface of the substrate 201, which can be for example, any semiconductor wafers, semiconductor substrates, silicon substrates, SOI substrates, among others.

First, at step 712, a first material layer (e.g., the first material layer 622 as shown in FIG. 6), such as a heavily doped material layer and/or a conductive metal material layer, is deposited over the surface of a substrate by placing the substrate within a substrate processing chamber and performing a deposition process. In one example, a polysilicon layer having a doping level of above 1E16-1E18 atoms/cm$^3$ is deposited as the first material layer 622 over a substrate surface by a CVD or PVD process. The thickness of the first material layer 622 and the second material layer 626 may be between about 50 Å and 500 Å thick.

Then, at step 714, a non-linear resistive layer, (e.g., the non-linear resistive 624 as shown in FIG. 4), such as a lightly doped material layer, is deposited over the surface of the substrate in the same or different substrate processing chamber. The thickness of the non-linear resistive layer 624 may be between about 50 Å and about 500 Å thick. The non-linear resistive layer 624 can be doped with a low dopant concentration of about 1E19 atoms/cm$^3$ or below, such as between about 1E16 atoms/cm$^3$ and about 1E19 atoms/cm$^3$ (e.g., between about 1E16 atoms/cm$^3$ and about 5E17 atoms/cm$^3$). In one example, a polysilicon layer having a doping level of 1E17 atoms/cm$^3$ is deposited as the non-linear resistive layer 624 over the surface of the first material layer 622 by a CVD, ALD or PVD process.

Next, step 716, a second material layer (e.g., the second material layer 626 as shown in FIG. 6), such as a heavily doped material layer and/or a conductive metal material layer, is deposited over the surface of the substrate in the same or different substrate processing chamber such that the non-linear resistive layer 624 is disposed between the first material layer 622 and the second material layer 626. In one example, a polysilicon layer having a doping level of above 1E18 atoms/cm$^3$ is deposited as the second material layer 626 over the surface of the non-linear resistive layer 624 by a CVD or PVD process. The thickness of the second material layer 626 may be between about 50 Å and 500 Å thick In some embodiments, the non-linear resistive layer 624, the first material layer 622 and the second material layer 626, as shown in FIG. 6, can be deposited using a deposition process, including but not limited to, CVD (e.g., LPCVD, PECVD), ALD (e.g., PEALD), physical vapor deposition (PVD), liquid deposition processes, ion implants, and epitaxial processes, among others. In some embodiments, the non-linear resistive layer 624 is deposited in situ over the surface of the first material layer 622. In some embodiments, the second material layer 626 is deposited in situ over the surface of the non-linear resistive layer 624.

For example, a polycrystalline silicon layer can be deposited and doped with a dopant in a CVD deposition process to a thickness of about 10 Å and 5000 Å thick at a temperature of 300° C. or above, such as between 580° C. and 650° C. In one example, the resistor structure 220 is formed by depositing a polysilicon film by CVD, doping the polysilicon film with an n-type dopant, such as phosphorus (P) or arsenic (As), or p-type dopant, such as boron (B), aluminum (Al) to the appropriate dopant level to sequentially form each of the first material layer 622, the non-linear resistive layer 624, and the second material layer 626. Alternatively, doping of the first material layer 622, the non-linear resistive layer 624, and the second material layer 626 may be performed after each of the first material layer, the non-linear resistive layer, and the second material layer is deposited (e.g., doping a deposited film by an ion implant process).

Additional conductive metal material layers can be deposited between the first material layer 622 and the variable resistance layer 630. For example, a conductive metal material including a conductive metal material, such as titanium nitride (TiN), titanium (Ti), tantalum nitride (TaN), tantalum (Ta), tungsten (W), among others, can be deposited by a suitable CVD, PVD or other deposition process over the surface of the first material layer 622. In addition, one or more conductive metal material layers including titanium nitride (TiN), titanium (Ti), tantalum nitride (TaN), tantalum (Ta), or tungsten (W), can be deposited between the second material layer 626 and an electrode layer or between the second material layer 626 and the variable resistance layer 630.

In some embodiments, the first and the second material layers 622, 626 contain a heavily doped polysilicon material and/or a conductive material. Examples of the first and second material layers of the resistor structure include a conductive metal layer, a heavily doped N$^+$ layer, a heavily doped P$^+$ layer, etc. The conductive metal layer may include a metal material, such as titanium nitride (TiN), titanium (Ti), tantalum nitride (TaN), tantalum (Ta), tungsten (W) at a thickness of between about 50 Å and 500 Å.

In some embodiments, the first material layer 622 includes a first conductive metal material layer and a heavily doped N$^+$ layer, and the second material layer 626 includes a second conductive metal material layer and a heavily doped N$^+$ layer. In another embodiment, the first material layer 622 includes a first conductive metal material layer and a heavily doped P$^+$ layer, and the second material layer 626 includes a second conductive metal material layer and a heavily doped P$^+$ layer. The first and the second conductive metal material layers generally include titanium nitride (TiN), titanium (Ti), tantalum nitride (TaN), tantalum (Ta), tungsten (W) and can be deposited by a deposition process, including CVD (e.g., LPCVD, PECVD), ALD (e.g., PEALD), physical vapor deposition (PVD), liquid deposition processes, ion implants, and epitaxial processes. In such cases, the first and/or the second conductive metal materials layers can act as barrier layers to prevent damages caused by electron leakage.

In one example, the resistor structure 220 includes an n-type or p-type doped polysilicon layer that is formed using a CVD process. By adjusting the doping level and type of dopant atom in the formed layer, the resistivity of the doped polysilicon layer can be varied from between about $10^{-5}$ Ω-cm and about $10^5$ Ω-cm. In one example, a p-type polysilicon layer having a resistivity of about 0.1 Ω-cm is achieved by forming a silicon layer that has a boron (B) doping level of about 8.0 E16 atoms/cm$^3$. In yet another example, the resistor structure 220 includes a conductive metal material, such as titanium nitride (Ti$_x$N$_y$), tantalum nitride (Ta$_x$N$_y$), hafnium nitride (Hf$_x$N$_y$) or titanium aluminum nitride (Ti$_x$Al$_y$N$_z$) layer that is formed using an ALD, CVD or PVD process. In some deposition processes, the resistivity of the material layers within the resistor structure is controlled by adjusting the partial pressure of nitrogen in the processing region of the deposition chamber during a CVD, PVD, or ALD deposition process.

At step 720 of FIG. 7, the variable resistance layer 206 is formed in series with the resistor structure 220 in the memory cell 200. The variable resistance layer 206 disposed in the memory cell 200 can be a dielectric material, such as a metal oxide material or other similar material that can be switched between at least two or more stable resistance states. In some embodiments, the variable resistance layer 206 is a high band gap material (e.g., band gap >4 electron volts (eVs)), such as hafnium oxide (Hf$_x$O$_y$), tantalum oxide (Ta$_x$O$_y$), aluminum oxide (Al$_x$O$_y$), lanthanum oxide (La$_x$O$_y$), yttrium oxide (Y$_x$O$_y$), dysprosium oxide (Dy$_x$O$_y$), ytterbium oxide (Yb$_x$O$_y$) and zirconium oxide (Zr$_x$O$_y$). It has been found that using high band gap variable resistance layer materials will improve data retention in the resistive switching memory element 112, and reduce the leakage current in the formed memory element cell, since the amount of trapped charge in the variable resistance layer material will be less than a lower band gap material, and the high band gap materials create a large barrier height that the carriers have to cross during the read, set and reset operations. In other embodiments, lower band gap metal oxide materials can be used, such as titanium oxide (TiO$_x$), nickel oxide (NiO)$_x$ or cerium oxide (CeO$_x$) may be advantageous for some embodiments. In some cases, a semiconductive metal oxide (p-type or n-type) such as zinc oxides (Zn$_x$O$_y$), copper oxides (Cu$_x$O$_y$), and their nonstoichiometric and doped variants can be used.

The variable resistance layer 206 may include a metal oxide (e.g., HfO$_2$) layer formed to a thickness of between about 10 and about 100 angstroms (Å). In some embodiments, the variable resistance layer 206 is doped with a material that has an affinity for oxygen (e.g., transition metals (Al, Ti, Zr)) to form a metal-rich variable resistance layer (e.g., FifO$_{1.7}$ vs. HfO$_2$), which is deficient in oxygen, and thus has a larger number of oxygen vacancy type defects. The additional vacancy defects can reduce the required switching and forming voltages, reduce the operating current(s), and reduce the cell-to-cell variation in a formed memory element.

In one example, the variable resistance layer 206 may include a metal oxide layer, such as Hf$_x$O$_y$, Ta$_x$O$_y$, Al$_x$O$_y$, La$_x$O$_y$, Y$_x$O$_y$, Dy$_x$O$_y$, Yb$_x$O$_y$ and/or Zr$_x$O$_y$, formed to a thickness of between about 20 Å and about 100 Å, such as between about 30 angstroms and about 50 Å. The variable resistance layer 206 can be deposited using any desired technique, but in some embodiments described herein is deposited using an ALD process. In some embodiments, the variable resistance layer 206 can be deposited using a CVD (e.g., LPCVD, PECVD) or ALD (e.g., PEALD), physical vapor deposition (PVD), liquid deposition processes, and epitaxial processes. It is believed that PEALD processes can be used to control defects and improve switching and forming voltages in some embodiments. In one example, tetrakis(dimethylamino) hafnium (TDMAH) and an oxygen containing precursor at a temperature of about 250° C. is used in an ALD process to form an 50 Å thick of hafnium oxide containing variable resistance layer 206.

Optionally, at step 722, additional material layers are formed prior to or after the resistor structure 220 is formed over the surface of the substrate. It is noted that step 710 can be performed prior to or after step 720 and the order of performing the deposition steps depends on the design choice in forming the memory cell. For example, the resistor structure 220 can be formed over the surface of the substrate prior to, or after, the variable resistance layer 206 is deposited over the surface of the substrate. In addition, the electrode layers (e.g., the electrodes 102, 118, 210, 610, and/or 640 disposed in the memory cell 200 as shown in FIGS. 1A-1B, 2A-2B, 4, 6) can be deposited over the surface of the substrate prior to, or after, the material layers of the resistor structure 220 are deposited and the resistor structure 220 is formed.

The electrodes 102, 118, 210, 610, and/or 640 disposed in the memory cell 200 as shown in FIGS. 1A-1B, 2A-2B, 4 FIG. 4, 6, are generally formed from a conductive material that has a desirable conductivity and work function. In some configurations, the electrode 102, 118, 210, 610, and/or 640 disposed in the memory cell are each formed from different materials, which may include, but are not limited to p-type polysilicon, n-type polysilicon, transition metals, transition metal alloys, transition metal nitrides, and transition metal carbides. In one example, the 102, 118, 210, 610, and/or 640 include a metal, metal alloy, metal nitride or metal carbide formed from an element selected from a group consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combination thereof. In one example, the electrodes 102, 118, 210, 610, and/or 640 include a metal alloy selected from the group of a titanium/aluminum alloy, or a silicon-doped aluminum (AlSi). In one embodiment of the memory cells, the electrodes 102, 118, 210, 610, and/or 640 include a metal, such as a transition metal, transition metal alloy, transition metal carbide, transition metal nitride (e.g., TiN), and the intermediate electrode 210 includes a heavily doped semiconductor material, such as a heavily doped silicon material (e.g., n-type polysilicon material) that interfaces well with the current steering element 216. In one example, the intermediate electrode 210 includes a polysilicon material. The intermediate electrode may be between about 50 Å and about 500 Å thick, while the electrodes 102, 118, 210, 610, and/or 640 are between about 50 Å and about 5000 Å thick. The electrodes 102, 118, 210, 610, and/or 640 may include a conductive metal material, such as titanium nitride (TiN).

While omitted from the discussion above, the electrode 118 and the current steering element 216 and other elements can be formed over a portion of a substrate 201, such as a silicon substrate, by use of a physical vapor deposition (PVD), chemical vapor deposition (CVD), atomic layer deposition (ALD), or other similar process that is well known in the art. In one example, the electrode 118 includes a layer of titanium nitride (TiN) that is between about 500 Å and 1 μm thick and is formed by use of a PVD process. In some configurations, it is desirable to determine the empirical or theoretical resistance of the current steering element 216 in the resistive switching memory element 112, so that the resistance of the resistor structure 220 can be adjusted relative to the expected resistance of the current steering element 216. In one example, the current steering element 216 is a diode that includes a p-doped silicon layer (not shown) that is formed by a CVD process, an un-doped intrinsic layer (not shown) that is formed by an CVD process, and an n-doped silicon layer (not shown) that is formed by a CVD process.

At step 730, optionally, the entire material stack of the memory cell 200 can be subject to a post-deposition annealing treatment when the formed resistor structure 220 is fabricated in series with the variable resistance layer 206, the various electrode layers and any other additional material layers. The annealing treatment of the deposited material layers of the memory cell 200 may be performed, for example, at high temperature of between 200° C. and 750° C. and for a period of time (e.g., between 1 minute and 5 minutes).

It is noted that caution needs to be taken while performing the annealing treatment. During the annealing treatment, the material stack of the resistor structure 220 may undergo grain growth and some of the dopants in the first material layer 622, the non-linear resistive layer 624, and the second material layer 626 may segregate to the grain boundaries. In these cases, the active dopant concentration in the formed grains will likely be less than the average dopant concentration of the non-linear resistive layer 624, and a number of grain boundaries may pass through the thickness of the material stack of the non-linear resistive layer 624, which can cause electrical transport problems.

In general, each grain acts as a single crystalline $N^-$ resistor such that the non-linear resistive layer 624 may include a number of the single crystalline grains behaving as several resistors in parallel. In some cases, this behavior of a non-linear resistive polysilicon material can degrade the resistive property of the formed non-linear resistive layer 624. In addition, dopants from the heavily doped source and drain regions (e.g., the first material layer 622 and the second material layer 626) may diffuse to the grain boundaries and form additional highly doped regions around the grain boundaries that act as additional electron leakage paths between the first material layer 622 and the second material layer 626 (e.g., the source and drain regions). In one embodiment, additional conductive metal-containing barrier layers can be interposed between the first material layer 622 and the non-linear resistive layer 624 or between the second material layer 626 and the non-linear resistive layer 624 to prevent such excessive electron leakage that may cause damages to the memory cell. In one embodiment, the first and the second material layers 622, 626 are formed of conductive metal-containing barrier materials, such as titanium nitride (TiN), titanium (Ti), tantalum nitride (TaN), tantalum (Ta), tungsten (W), among others.

EXAMPLES

In some embodiments, after performing the processing sequence 700, the formed memory cell 200 includes: about 50 Å of a titanium nitride (TiN) layer (as the electrode 102), about 30 Å thick of a hafnium oxide ($HfO_x$) layer (as the variable resistance layer 206), about 50 Å thick of an n-doped polysilicon layer (as the intermediate electrode 210), and the resistor structure 220. The resistor structure 220 may be between about 10 Å and 1,000 Å thick and includes a $N^+$ polysilicon layer of between about 10 Å and 400 Å, a $N^-$ polysilicon layer of between about 10 Å and 500 Å, and a $N^+$ polysilicon layer of between about 10 Å and 400 Å. After forming the memory cell 200 having the resistor structure and the resistive switching memory element 112 and other material layers, the formed memory cell 200 is subject to at least one thermal processing step to anneal and/or activate the material layers in the formed memory cell 200.

As an example, the memory cell 200 may contain a resistor structure 220, having a desired thickness at an exemplary area of 20 nm×20 nm. For example, the thickness of the first material layer 622 may be about 20 nm, the length "L" for the non-linear resistive layer 624, as shown in FIG. 4, may be about 20 nm, and the thickness of the second material layer 626 may be about 20 nm. As another example, the resistor structure 220 may contain a $N^+$ polysilicon-containing first material layer, a $N^-$ polysilicon-containing lightly doped layer, and a $N^+$ polysilicon-containing second material layer, each with a thickness of about 20 nm, respectively. The n-type dopant used herein may be, for example, arsenic (As) and the 20 nm $N^+$ polysilicon-containing first material layer may be doped with arsenic to a concentration of about 1.0E19 atoms/$cm^3$. The 20 nm $N^-$ polysilicon-containing lightly doped material layer may be doped with arsenic to a concentration of about 1.0E15 atoms/$cm^3$. The 20 nm $N^+$ polysilicon-containing second material layer may be doped with arsenic to a concentration of between about 1.0E18 atoms/$cm^3$ and about 2.0E18 atoms/$cm^3$.

When applying a switching pulse to the memory cell 200, the resulting electrostatic potential distribution (V) across the film stack of the formed resistor structure 220 can be measured. For example, electrostatic potential distribution (V) of the 20 nm $N^+$ polysilicon-containing first material layer may be measured to be about 2.5 eV. The electrostatic potential distribution (V) of 20 nm $N^-$ polysilicon-containing lightly doped material layer may be measured to be between about 1.3 eV and about 2.5 eV. The electrostatic potential distribution (V) of the 20 nm $N^+$ polysilicon-containing second material layer may be measured to be between about 0.45 eV and about 1.3 eV.

In addition, when a current is flowing through the memory cell 200, the electron density (per $cm^3$) across the film stack of the formed resistor structure 220 can also be measured. For example, electron density of the 20 nm $N^+$ polysilicon-containing first material layer may be between about 1.5E18 and about 1.0E19 electrons per $cm^3$. The electron density of 20 nm $N^-$ polysilicon-containing lightly doped material layer may be about 9.5E17 electrons per $cm^3$. The electron density of the 20 nm $N^+$ polysilicon-containing second material layer may be about 9.5E17 electrons per $cm^3$.

In some embodiments, after performing the processing sequence 700 of FIG. 7, the memory cell 200 is formed and includes about 50 Å thick of an n-doped polysilicon layer (as the electrode 102), about 30 Å thick of a hafnium oxide ($HfO_x$) layer (as the variable resistance layer 206), and the resistor structure 220 and about 50 Å thick of a titanium nitride layer (as the electrode 118).

One example of the resistor structure 220 may include a titanium nitride (TiN) layer of between about 10 Å and 400 Å (to serve as the first material layer 622 of the resistor structure 220 and the intermediate electrode 210), a $N^-$ polysilicon layer of between about 10 Å and 1000 Å, and a titanium nitride (TiN) layer of between about 10 Å and 400 Å (as the second material layer 626 of the resistor structure 220). The $N^-$ polysilicon layer may be doped with phosphorus to a concentration of between about 1.0E17 atoms/$cm^3$ and about 1.0E18 atoms/$cm^3$. After forming the memory cell 200 having the resistor structure 220 and the resistive switching memory element 112 and other material layers, the formed memory cell 200 is subject to at least one thermal processing step to anneal and/or activate the whole material stack.

Another example of the resistor structure 220 includes a $N^+$ polysilicon-containing first material layer of between about 10 Å and 400 Å, an optional titanium nitride (TiN) layer of between about 10 Å and 400 Å (to serve as a barrier layer and prevent current leakage within the resistor structure 220), a $N^-$ polysilicon layer of between about 10 Å and 500 Å, another optional titanium nitride (TiN) layer of between about 10 Å and 400 Å (to serve as a barrier layer and prevent current leakage), and a N+ polysilicon-containing second material layer of between about 10 Å and 400 Å. The N+ polysilicon-containing first and second material layers may be doped with phosphorus to a concentration of between about 1.0E19 atoms/cm$^3$ and about 1.0E20 atoms/cm$^3$. The N− polysilicon-containing layer may be doped with phosphorus to a concentration of between about 1.0E17 atoms/cm$^3$ and about 1.0E18 atoms/cm$^3$.

Still another example of the resistor structure 220 includes a P+ polysilicon layer of between about 10 Å and 400 Å, a P− polysilicon layer of between about 10 Å and 500 Å, and a P+ polysilicon layer of between about 10 Å and 400 Å. The P− polysilicon layer may be doped with boron to a concentration of between about 1.0E17 atoms/cm$^3$ and about 1.0E18 atoms/cm$^3$. The P+ polysilicon-containing first and second material layers may be doped with boron to a concentration of between about 1.0E19 atoms/cm$^3$ and about 1.0E20 atoms/cm$^3$. The formed memory cell 200 is generally subject to at least one thermal processing step to anneal or cure the whole material stack.

For a thickness ("L") of about 20 nm N− polysilicon-containing lightly doped material layer, the electric field energy (E) is calculated as a function of voltage (V) and the results are shown below.

| Voltage (V) | E(V/cm) |
|---|---|
| 0.1 | 5.00E+04 |
| 0.2 | 1.00E+05 |
| 0.3 | 1.50E+05 |
| 0.4 | 2.00E+05 |
| 0.5 | 2.50E+05 |
| 0.6 | 3.00E+05 |
| 0.8 | 4.00E+05 |
| 1 | 5.00E+05 |
| 1.2 | 6.00E+05 |
| 1.5 | 7.50E+05 |
| 2 | 1.00E+06 |

Figure 8:
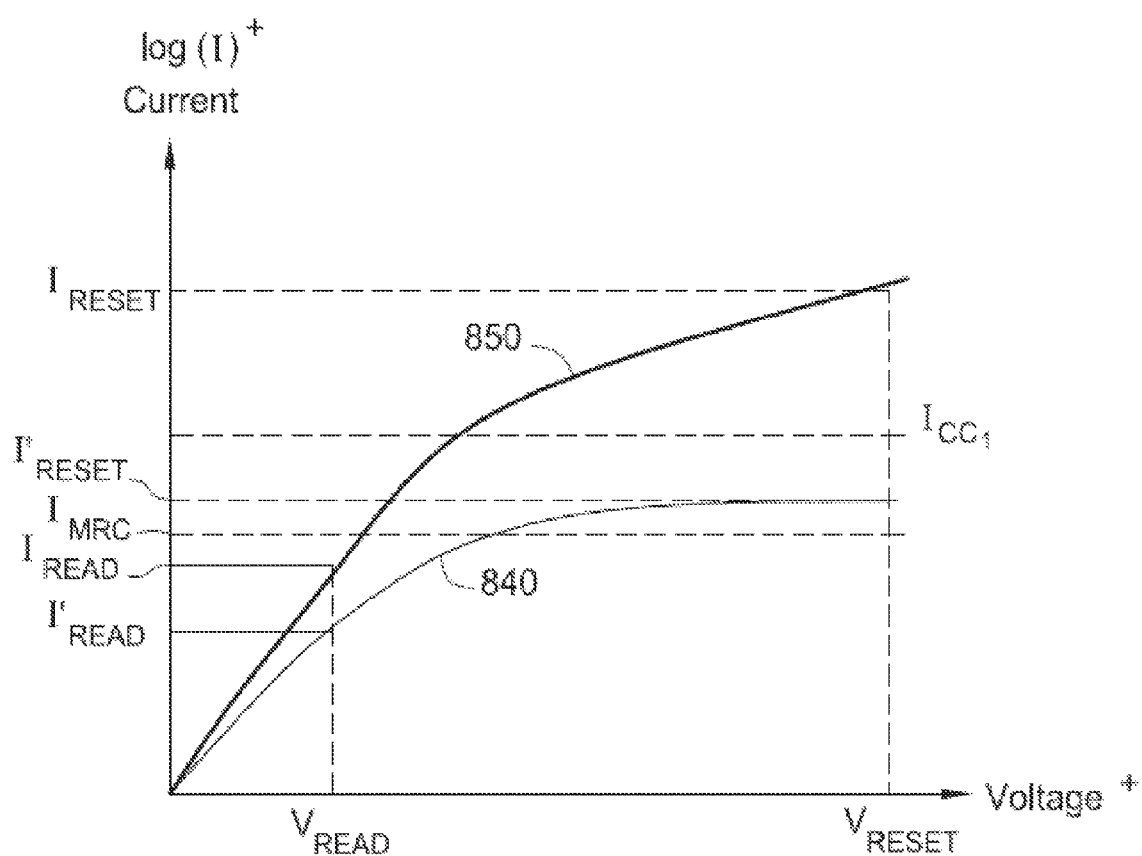
FIG. 8 is a current versus voltage plot illustrating the characteristics of a number of memory cells, each having a two-terminal resistor structure disposed therein in accordance with some embodiments.

FIG. 8 demonstrates the results of the measured current-versus-voltage (I-V) electrical characteristics, when the memory cell is in the "On" state, for a number of exemplary memory cells having a resistor structure 220 (e.g., curve 840), as compared to memory cells without any resistor structure 220 (e.g., curve 850).

For comparison, the I-V characteristics of a convention memory cell (without the resistor structure 220) generally follows the curve 850. The curve 850 exhibits a relatively linear I-V relationship at both low and high voltage levels (e.g., Voltage=current (I)×Resistance (R)). The current ($I_{RESET}$) flowing through a conventional memory cell at $V_{RESET}$, as illustrated by the curve 850, often exceeds the specification required level, $I_{CC}$.

The I-V characteristics of an exemplary memory cell 200 with the resistor structure 220 generally follow the curve 840. The curve 840 exhibits an overall non-linear resistance curve, having a linear I-V relationship at low voltage levels (e.g., at voltage levels near $V_{READ}$), and the currents remain relatively constant at high voltage levels (e.g., at around $V_{RESET}$). The current ($I_{RESET}$) flowing through the exemplary memory cell 200 at $V_{RESET}$ is smaller than the current compliance level, $I_{CC}$.

Various doped material layers and conductive metal material layers can be selected to form the resistor structure 220 and provide desirable electrical properties, while still exhibiting the non-linear resistance curve similar to the curve 840. Accordingly, incorporating into the memory cell 200 the resistor structure 220 having the electrical characteristics as shown in the curve 840 prevents the "set" and "reset" currents measured at $V_{SET}$ and $V_{RESET}$ voltages from being over $I_{CC}$. Thus, the incorporation of the resistor structure 220 is very useful in forming an array of memory cells such that each memory cell 200 exhibits a low leakage current and is protected from being damaged during the application of the set, reset, or switching pulses during programming operations.

The foregoing is merely illustrative of the principles and various modifications can be made by those skilled in the art without departing from the scope and spirit of the disclosure as defined by the claims that follow.

The invention claimed is:

1. A memory cell comprising:
   a first electrode layer;
   a variable resistance layer comprising a resistive switching material capable of switching between two resistive states upon application of a predetermined voltage to the variable resistance layer; and
   a resistor structure,
      the resistor structure comprising a lightly doped polysilicon layer,
      wherein the first electrode layer, the resistance layer, and the resistor structure form a stack and are interconnected in series within the stack,
      wherein the lightly doped polysilicon layer has a dopant concentration of less than $10^{16}$ atoms/cm$^3$, and
      wherein the lightly doped polysilicon layer has a resistivity of at least 1 Ohm-cm in a direction along the height of the stack.

2. The memory cell of claim 1, wherein the resistor structure is operable a second electrode layer of the memory cell.

3. The memory cell of claim 2, wherein the lightly doped polysilicon layer has a resistivity of less than 0.001 Ohm-cm within a plane normal to the height of the stack.

4. The memory cell of claim 2, wherein the resistor structure is shared by multiple memory cells.

5. The memory cell of claim 1, wherein the resistor structure is homogeneous and directly interfaces the variable resistance layer.

6. The memory cell of claim 1, wherein the resistor structure comprises multiple layers having different compositions, and wherein the multiple layers comprise a non-linear resistive layer comprising the lightly doped polysilicon layer.

7. The memory cell of claim 6, wherein the multiple layers further comprise an intermediate electrode layer, the intermediate electrode layer interfaces with the variable resistance layer and disposed between the non-linear resistive layer and the variable resistance layer.

8. The memory cell of claim 7, wherein the intermediate electrode layer comprises a highly doped polysilicon having a dopant concentration of at least 1018 atoms/cm3.

9. The memory cell of claim 6, wherein the multiple layers further comprise a diffusion barrier layer, the diffusion barrier layer disposed between the current limiting layer and the variable resistance layer.

10. The memory cell of claim 9, wherein the diffusion barrier layer comprises one of titanium nitride, tantalum nitride, indium oxide, copper silicide, or tungsten nitride.

11. The memory cell of claim 1, wherein the resistive switching material comprises one of hafnium oxide, tantalum oxide, aluminum oxide, lanthanum oxide, yttrium oxides, dysprosium oxide, ytterbium oxide, or zirconium oxide.

12. The memory cell of claim 1, wherein the electrode layer comprises one of highly doped polysilicon, titanium nitride, aluminum, or tungsten.

13. The memory cell of claim 1, wherein the lightly doped polysilicon layer comprises one of phosphorus, arsenic, or antimony.

14. The memory cell of claim 1, wherein the lightly doped polysilicon layer comprises one of boron, aluminum, indium, or gallium.

15. The memory cell of claim 1, wherein the lightly doped polysilicon layer has a breakdown voltage of at least 8V.

16. The memory cell of claim 1, wherein the resistor structure has a thickness of less than 200 Angstroms.

17. The memory cell of claim 1, wherein the resistor structure has a thickness of less than 50 Angstroms.

18. The memory cell of claim 1, wherein the lightly doped polysilicon layer has a resistivity of less than 0.001 Ohm-cm within a plane normal to the height of the stack.

19. The memory cell of claim 1, wherein the lightly doped polysilicon layer has a resistivity of less than 10-6 Ohm-cm within a plane normal to the height of the stack.

20. A memory cell comprising:
    a first electrode layer comprising titanium nitride;
    a variable resistance layer comprising a resistive switching material capable of switching between two resistive states upon application of a predetermined voltage to the variable resistance layer the resistive switching materials comprising transitional metal oxide; and
    a resistor structure,
        the resistor structure comprising a lightly doped polysilicon layer, a highly doped polysilicon layer, and a diffusion barrier layer disposed between the lightly doped polysilicon layer and the highly doped polysilicon layer,
        wherein the first electrode layer, the resistance layer, and the resistor structure form a stack and are interconnected in series within the stack,
        wherein the lightly doped polysilicon layer having a dopant concentration of less than $10^{16}$ atoms/cm$^3$,
        wherein the lightly doped polysilicon layer has a resistivity of at least 1 Ohm-cm in a direction along the height of the stack,
        wherein the highly doped polysilicon directly interfaces the variable resistance layer and has a dopant concentration of less than $10^{18}$ atoms/cm$^3$.

* * * * *